United States Patent
Komura et al.

(10) Patent No.: US 8,742,786 B2
(45) Date of Patent: Jun. 3, 2014

(54) SEMICONDUCTOR DEVICE AND OPERATION MONITORING METHOD FOR SEMICONDUCTOR DEVICE

(75) Inventors: Kazufumi Komura, Kasugai (JP); Katsumi Furukawa, Kasugai (JP); Keiichi Fujimura, Kasugai (JP); Takayoshi Nakamura, Kasugai (JP); Tohru Yasuda, Kasugai (JP); Hirohisa Nishiyama, Kasugai (JP); Nobuyoshi Nakaya, Kasugai (JP); Kanta Yamamoto, Kasugai (JP); Shigetaka Asano, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 798 days.

(21) Appl. No.: 12/410,157

(22) Filed: Mar. 24, 2009

(65) Prior Publication Data

US 2009/0243627 A1 Oct. 1, 2009

(30) Foreign Application Priority Data

Mar. 31, 2008 (JP) .................................. 2008-92752

(51) Int. Cl.
  *G01R 31/02* (2006.01)
(52) U.S. Cl.
  USPC ............ 324/762.01; 324/762.02; 324/762.03; 324/762.05; 324/762.06; 324/763.01; 714/30; 714/36; 702/117
(58) Field of Classification Search
  USPC .................... 324/762.01–762.06; 714/30, 36; 702/117
  See application file for complete search history.

(56) References Cited

U.S. PATENT DOCUMENTS

| 4,833,395 A | * | 5/1989 | Sasaki et al. ............... 324/750.3 |
| 5,514,976 A | * | 5/1996 | Ohmura ................. 324/762.01 |
| 5,723,875 A | | 3/1998 | Abe et al. |
| 5,847,561 A | * | 12/1998 | Whetsel ................. 324/762.02 |
| 6,002,732 A | * | 12/1999 | Makino ........................ 375/374 |
| 6,275,055 B1 | * | 8/2001 | Hyozo et al. .............. 324/750.3 |
| 6,507,183 B1 | * | 1/2003 | Mulatti et al. ............. 324/99 D |
| 7,250,770 B2 | * | 7/2007 | Tanaka ......................... 324/527 |
| 7,301,359 B2 | * | 11/2007 | Furukawa ................ 324/750.03 |
| 7,483,799 B2 | * | 1/2009 | Sakaguchi ..................... 702/76 |
| 7,489,150 B2 | * | 2/2009 | Norris ...................... 324/750.09 |
| 7,541,798 B2 | * | 6/2009 | Yoshida ..................... 324/76.11 |
| 7,558,692 B2 | * | 7/2009 | Suda et al. .................... 702/107 |
| 7,567,882 B2 | * | 7/2009 | Asano et al. .................. 702/117 |
| 7,793,174 B2 | * | 9/2010 | Hattori et al. ................. 714/718 |
| 8,519,730 B2 | * | 8/2013 | Miyazaki ................ 324/762.01 |
| 8,531,197 B2 | * | 9/2013 | Fefer et al. ................ 324/750.3 |
| 8,542,030 B2 | * | 9/2013 | Cher et al. .............. 324/762.01 |

(Continued)

FOREIGN PATENT DOCUMENTS

JP 09-116102 5/1997

*Primary Examiner* — Tung X Nguyen
*Assistant Examiner* — Thang Le
(74) *Attorney, Agent, or Firm* — Arent Fox LLP

(57) ABSTRACT

A semiconductor device includes a monitor including a first element coupled between a first power supply line and a second power supply line, and a load for increasing a load value between the first element and the first power supply line or the second power supply line, and a determination unit which determines an operating state of the first element based on an output of the monitor.

19 Claims, 24 Drawing Sheets

(56) References Cited

U.S. PATENT DOCUMENTS

| | | |
|---|---|---|
| 2004/0113642 A1* | 6/2004 | Sugimoto et al. ............. 324/754 |
| 2005/0270054 A1* | 12/2005 | Van Hees ...................... 324/765 |
| 2007/0024311 A1* | 2/2007 | Ohashi et al. ................. 324/765 |
| 2007/0108998 A1* | 5/2007 | Ito et al. ........................ 324/754 |
| 2007/0245200 A1* | 10/2007 | Hattori et al. ................. 714/742 |
| 2007/0257696 A1* | 11/2007 | Eldridge et al. .............. 324/765 |
| 2007/0296441 A1* | 12/2007 | Whetsel ........................ 324/763 |
| 2008/0204065 A1* | 8/2008 | Whetsel ........................ 324/765 |

\* cited by examiner

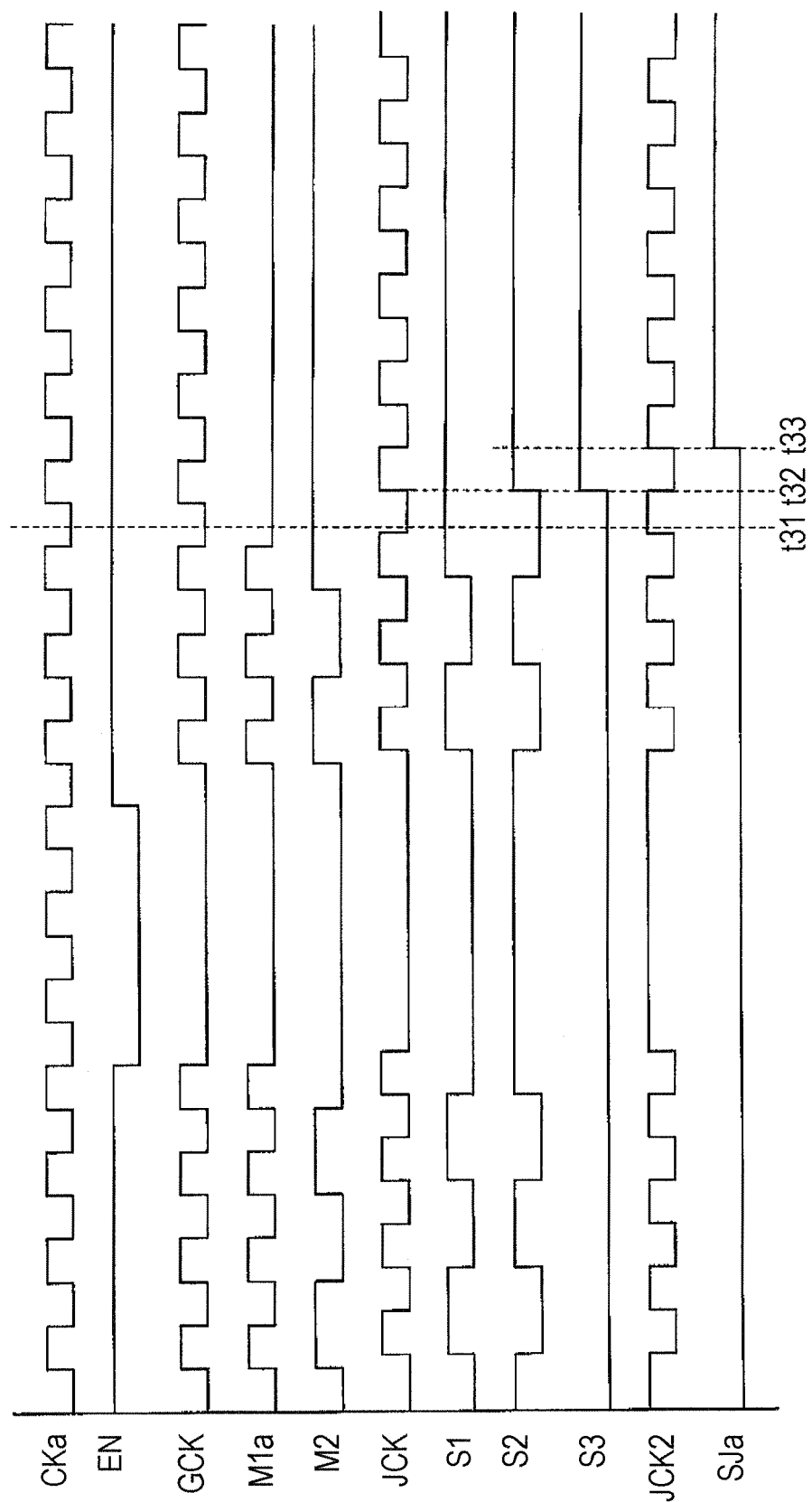

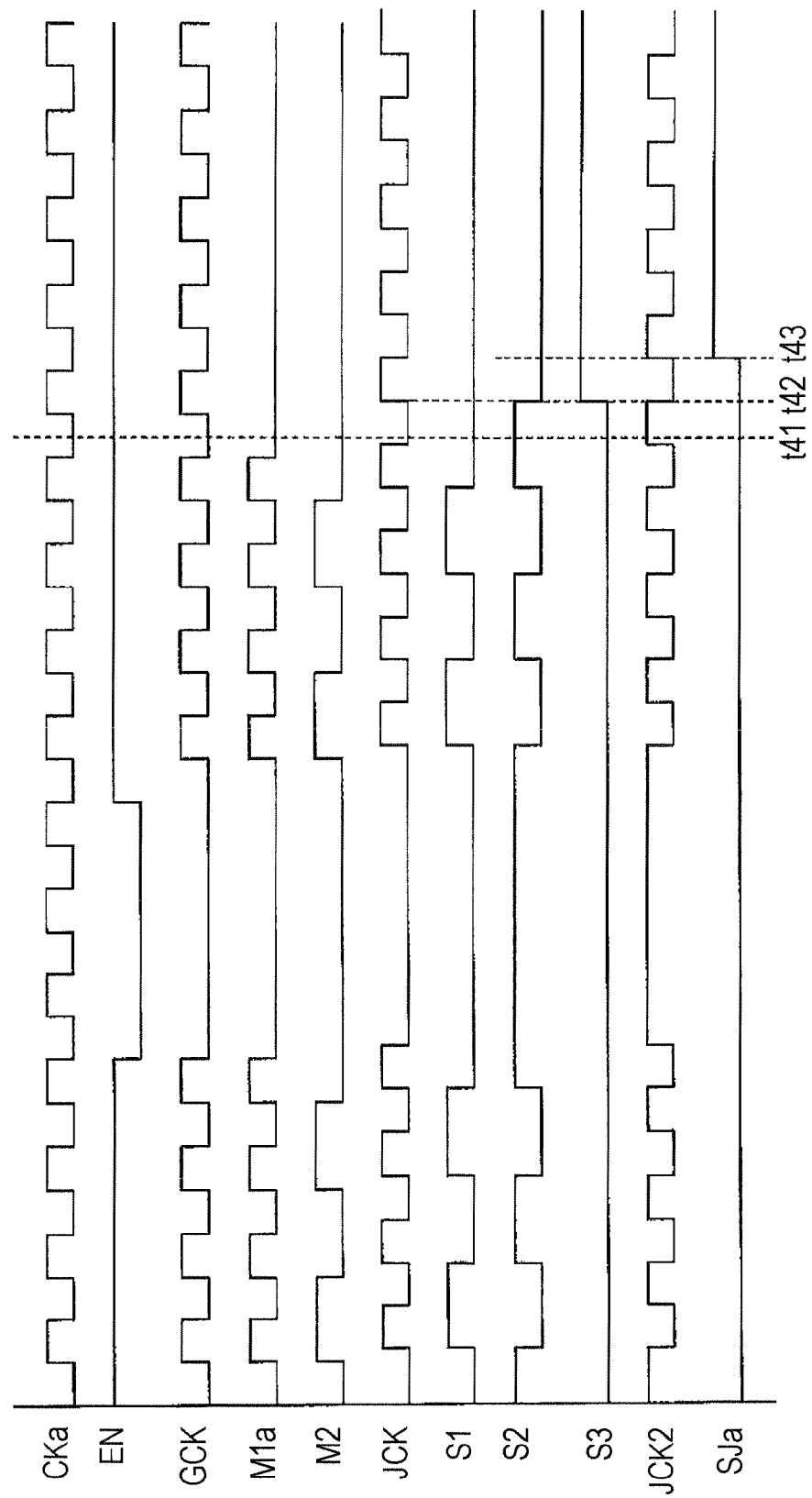

SEMICONDUCTOR DEVICE AND OPERATION MONITORING METHOD FOR SEMICONDUCTOR DEVICE

CROSS-REFERENCES TO RELATED APPLICATIONS

This application is based upon and claims the benefit of priority of the prior Japanese Patent Application No. 2008-092752, filed on Mar. 31, 2008, the entire contents of which are incorporated herein by reference.

FIELD

The embodiments discussed herein are related to a semiconductor device and an operation monitoring method for a semiconductor device.

BACKGROUND

A failure of a semiconductor device may occur due to electro-migration. The term "electro-migration" refers to a phenomenon wherein when a current is supplied to flow through (wiring) lines for a power supply, etc., metal atoms are migrated with momentum exchange between electrons flowing through the lines and metal ions included in the lines. The migration of metal atoms causes wiring to electrically disconnect or break. Thus, the electro-migration raises a problem in trying to ensure reliability of the semiconductor device.

To overcome the above-described problem, the semiconductor device includes a failure prediction circuit. The failure prediction circuit includes a conductive pattern coupled between a power supply line at a high potential and a power supply line at a low potential, and monitors a voltage at the conductive pattern.

Because the electro-migration occurs when a current is supplied to flow through a (wiring) line, the electro-migration may occur not only in a power supply line, but also in a signal line. In other words, the electro-migration may occur in a line for electrically interconnecting logical circuits and transmitting a signal, and may cause an electrical disconnection of the line between the logical circuits. Such a failure is locally generated inside a function block formed in the semiconductor device, and is not detected in a circuit for predicting a typical failure. It is, therefore, difficult to improve reliability.

SUMMARY

According to an aspect of embodiments, a semiconductor device includes a monitor, which includes a first element coupled between a first power supply line and a second power supply line, a load for increasing a load value between the first element and the first power supply line or the second power supply line, and a determination unit which determines an operating state of the first element based on an output of the monitor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

These and/or other aspects and advantages will become apparent and more readily appreciated from the following description of the embodiments, taken in conjunction with the accompanying drawings of which:

FIG. 10 depicts operation waveforms of the monitor circuit in FIG. 5 and the determination circuit in FIG. 5 in the third case where the monitor circuit has failed;

FIG. 11 depicts operation waveforms of the monitor circuit in FIG. 5 and the determination circuit in FIG. 5 in the fourth case where the monitor circuit has failed;

DESCRIPTION OF EMBODIMENTS

A first embodiment is described with reference to FIGS. 1A to 4.

Figure 1A:
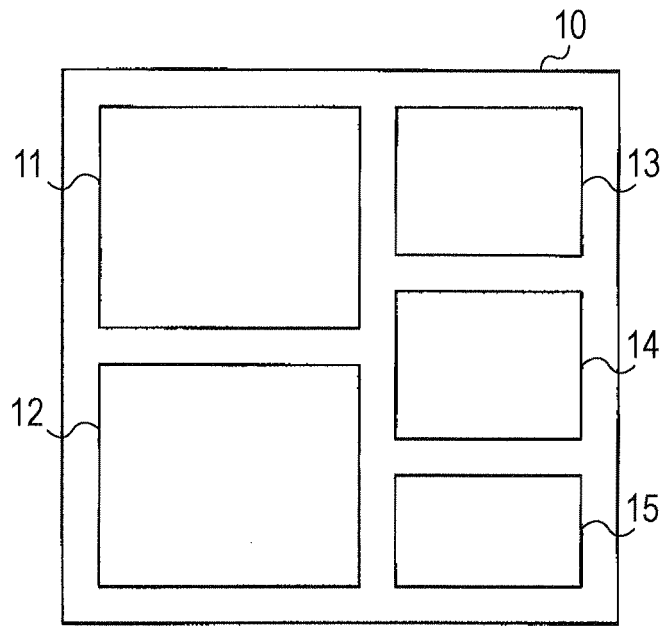
FIGS. 1A and 1B depict a semiconductor device related to embodiments.

As depicted in FIG. 1A, a semiconductor device 10 includes a plurality of function blocks 11 to 15.

Figure 1B:
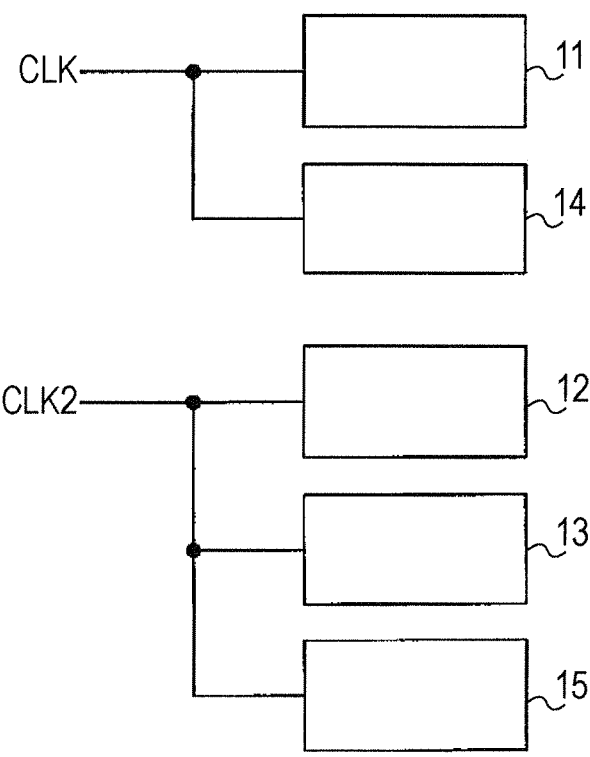

As depicted in FIG. 1B, a clock signal CLK is supplied to the function blocks 11 and 14. A dock signal CLK2 is supplied to the function blocks 12, 13 and 15.

As depicted in FIGS. 1A and 1B, respective frequencies of the clock signals CLK and CLK2 are set depending on operations executed in the function blocks 11 to 15 which receive the ouput clock signals. For example, the function block 11 may be a processing circuit for executing high-speed computations, and the function block 14 may be a high-speed communication circuit. The function blocks 12, 13 and 15 may include a random logic circuit, a low-speed communication circuit, and/or other circuits. In other words, the function blocks 11 and 14 may be required to execute higher-speed operations than the function blocks 12, 13 and 15. Therefore, the clock signal CLK having a higher frequency than the clock signal CLK2 is supplied to the function blocks 11 and 14. While both the clock signals CLK and CLK2 are supplied from the outside of the semiconductor device 10 in the first embodiment, a supply source of the clock signals is not limited to a particular source provided the clock signals are supplied at frequencies based on the operations of the function blocks 11 to 15. For example, the clock signal CLK2 may be generated from the clock signal CLK on the semiconductor device by using a frequency divider, a PLL or the like, and then supplied to the function blocks 12, 13 and 15.

As described above, electro-migration is one factor which may cause a failure during the operation of a semiconductor device. The term "electro-migration" refers to a phenomenon wherein when a current is supplied to flow through (wiring) lines for a power supply, etc., metal atoms are migrated with momentum exchange between electrons flowing through the lines and metal ions included in the lines. The migration of metal atoms causes a wiring to electrically disconnect or break. Thus, the electro-migration is more apt to generate at locations where the current is more frequently turned on and off. Stated another way, the probability of failure is higher in a path where a signal level is changed at a shorter cycle, i.e., where a signal having a higher frequency is transmitted.

As further depicted in FIGS. 1A and 1B, in the case of the semiconductor device 10, the probability of a failure due to the electro-migration is higher in portions (such as paths, circuit elements, and lines) where the clock signals CLK and CLK2 are transmitted than in portions where the signal level is changed at random. Also, the probability of the failure is higher in portions where the clock signal CLK is transmitted than in portions where the clock signal CLK2 having a lower frequency than the clock signal CLK is transmitted. Thus, the function blocks supplied with the clock signal CLK has a higher probability of occurrence of the failure than the function blocks supplied with the clock signals CLK2. In other words, the function blocks supplied with the clock signals CLK include shorter lives than the function blocks supplied with the clock signals CLK2. Namely, the function blocks 11 and 14 are shorter-life blocks, and the function blocks 12, 13 and 15 are longer-life blocks.

For that reason, each of the function blocks 11 and 14 of the semiconductor device 10 may include a detection circuit for detecting the failure attributable to the signal supplied by the clock signal CLK. Further, each of the function blocks 11 and 14 may include a plurality of sub-blocks having a similar configuration such that the sub-blocks may be selectively operated in a switching manner. The provision of the detection circuit and the sub-blocks enables the semiconductor device 10 in FIGS. 1A and 1B to operate for a longer period of time than the known device.

In the configuration of the function block 11 in FIGS. 1A and 1B, a section related to the detection circuit and the sub-blocks is described below with reference to FIG. 2.

Figure 2:
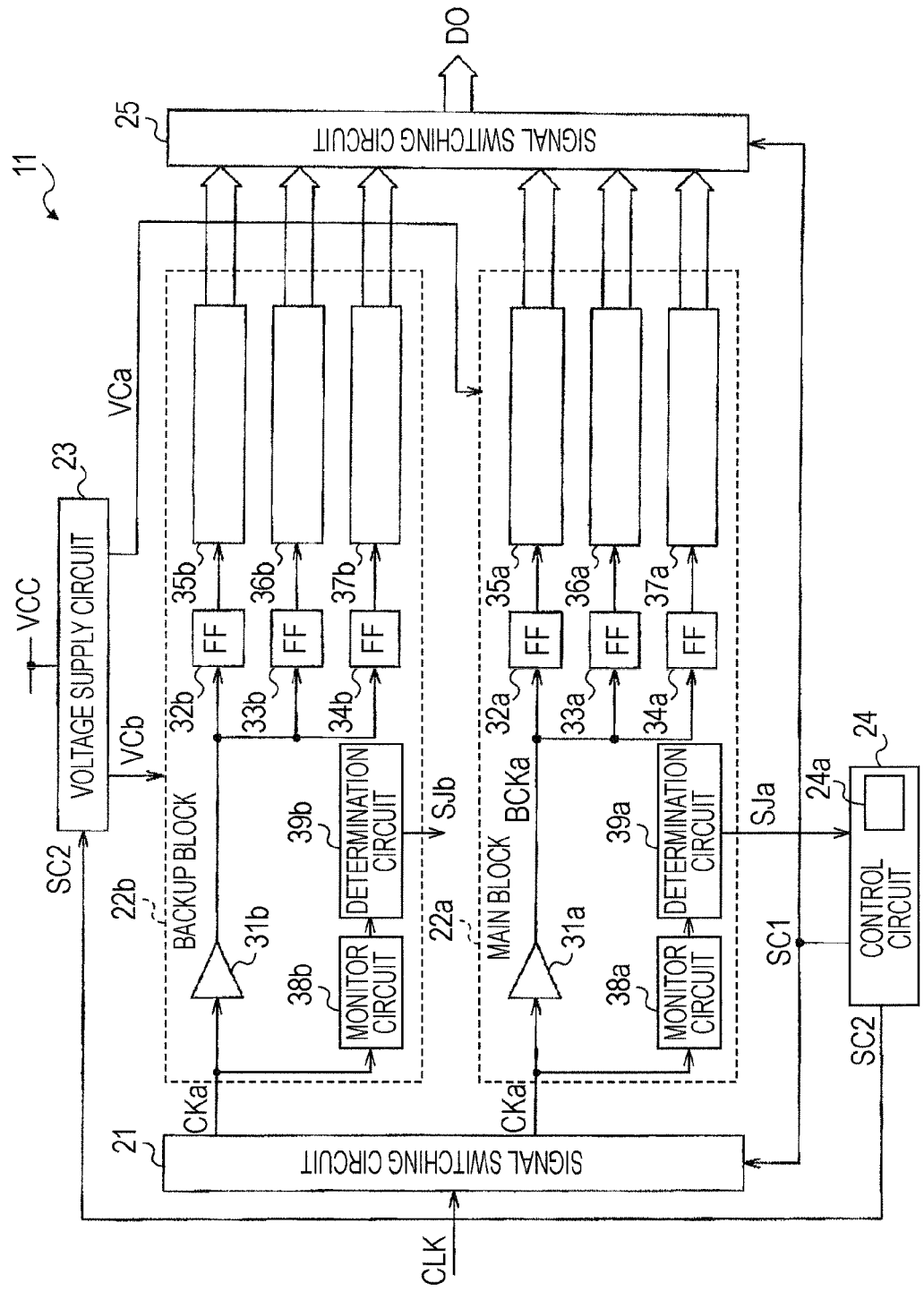
FIG. 2 depicts a first embodiment.

As depicted in FIG. 2, the function block 11 includes a first signal switching circuit 21, a main block 22a and a backup block 22b each serving as a sub-block, a voltage supply circuit 23, a control circuit 24, and a second signal switching circuit 25.

As further depicted in FIG. 2, the clock signal CLK is input to the first signal switching circuit 21. A first control signal SC1 is input to the first signal switching circuit 21 from the control circuit 24. In response to the first control signal SC0, the first signal switching circuit 21 selectively outputs the clock signal CLK to one of the main block 22a and the backup block 22b in a switching manner between both the blocks. For example, the first signal switching circuit 21 outputs the clock signal CLK to the main block 22a in response to the first control signal SC1 at a H-level and outputs the clock signal CLK to the backup block 22b in response to the first control signal SC1 at a L-level. To distinguish the clock signals output to the main block 22a and the backup block 22b from each other, the clock signal output to the main block 22a is called a first clock signal CKa and the clock signal output to the backup block 22b is called a second clock signal CKb.

As further depicted in FIG. 2, a drive voltage VCC is supplied to the voltage supply circuit 23. A second control signal SC2 is also input to the voltage supply circuit 23 from the control circuit 24. The voltage supply circuit 23 supplies a first drive voltage VCa to the main block 22a based on the drive voltage VCC. The voltage supply circuit 23 supplies a second drive voltage VCb to the backup block 22b based on the drive voltage VCC. In response to the second control signal SC2, the voltage supply circuit 23 controls supply/stop of the first drive voltage VCa and the second drive voltage VCb.

As further depicted in FIG. 2, the main block 22a and the backup block 22b may include a similar circuit configuration and may provide a similar function (i.e., the function of a high-speed processing circuit). The main block 22a comes into an operable state with the first drive voltage VCa supplied thereto and operates in sync with the first clock signal CKa. Similarly, the backup block 22b comes into an operable state with the second drive voltage VCb supplied thereto and operates in sync with the second clock signal CKb.

As further depicted in FIG. 2, a first determination signal S1a output from the main block 22a and a second determination signal SJb output from the backup block 22b are input to the control circuit 24. In response to the first determination signal SJa, the control circuit 24 switches over the sub-block that is to be operated. Stated another way, the control circuit 24 produces the first control signal SC1 and the second control signal SC2 such that the operating sub-block is switched over from the main block 22a to the backup block 22b.

For example, the control circuit 24 first produces the first control signal SC1 and the second control signal SC2 such that the main block 22a operates. In accordance with the first determination signal SJa, the control circuit 24 then produces the second control signal SC2 such that the second drive voltage VCb is supplied to the backup block 22b. After switching over the operating sub-block by producing the first control signal SC1 such that the second clock signal CKb is supplied to the backup block 22b, the control circuit 24 produces the second control signal SC2 so as to stop the supply of the first drive voltage VCa to the main block 22a.

Stated another way, in the function block 11 of the semiconductor device 10, the sub-block to which the clock signal CLK and the drive voltage VCC are supplied is switched over from the main block 22a to the backup block 22b. With the above-described configuration, the operation lasting time (life) of the function block 11 becomes about twice that of each of the main block 22a and the backup block 22b. Thus, the life of the semiconductor device 10 is prolonged in comparison with that of the known device including a single sub-block.

As further depicted in FIG. 2, the main block 22a and the backup block 22b output respective signals to the second signal switching circuit 25. The first control signal SC1 is input to the second signal switching circuit 25. In response to the first control signal SC1, the second signal switching circuit 25 selectively outputs the output signal of the main block 22a and the output signal of the backup block 22b in a switching manner between both blocks. For example, the second signal switching circuit 25 outputs the output signal of the main block 22a in response to the first control signal SC1 at a H-level and outputs the output signal of the backup block 22b in response to the first control signal SC1 at a L-level. The output signal of the second signal switching circuit 25 is input to the other function blocks 12 to 15. Thus, the output signal of the main block 22a and the output signal of the backup block 22b are supplied to the other function blocks 12 to 15 through the second signal switching circuit 25.

One example configuration of the main block 22a and the backup block 22b is described below. As further depicted in FIG. 2, the main block 22a includes a buffer circuit 31a, a plurality (three in the drawing) of flip-flops (hereinafter abbreviated to "FFs") 32a to 34a, and processing circuits 35a to 37a. The first clock signal CKa is input to the buffer circuit 31a for driving a plurality of logical elements. The buffer circuit 31a is a clock buffer and outputs a clock signal BCKa that is obtained by buffering the first clock signal CKa.

The clock signal BCKa is input to each clock terminal of the FFs 32a to 34a. In response to the clock signal BCKa, each of the FFs 32a to 34a latches a signal (not depicted) and outputs a signal having a similar level as that of the latched signal. The processing circuits 35a to 37a are each a circuit block configured to execute various processes such as computations, registering, fetching and decoding. The processing circuits 35a to 37a execute given processes based on the output signals of the FFs 32a to 34a or combinations of the output signals of the FFs 32a to 34a and other not-depicted signals, and then output signals depending on respective processing results.

As further depicted in FIG. 2, the main block 22a further includes a monitor circuit 38a and a determination circuit 39a.

The monitor circuit 38a and the determination circuit 39a are disposed to predict the life of the main block 22a. In the first embodiment, as described above, the life of the main block 22a corresponds to a period lasting until a failure occurs due to the electro-migration in an element on a transmission path of the first clock signal CKa. The element on the transmission path is the buffer circuit 31a.

The monitor circuit 38a is a buffer circuit for buffering the first clock signal CKa similarly to the buffer circuit 31a, and is arranged near the buffer circuit 31a. Generally, two logic circuits similarly configured and arranged close to each other include, for example, similar electrical characteristics and cause failures around a similar time frame at a high probability. Accordingly, if one of those two logic circuits is more apt to cause the failure, the failure of the other logic circuit is predicted by detecting the failure of the one logic circuit. In other words, by arranging an ordinary logic circuit and another logic circuit, which has been set to be more apt to cause a failure than the former logic circuit, close to each other and by detecting a failure of the latter logic circuit, a failure of the ordinary logic circuit may be predicted.

As further depicted in FIG. 2, in the first embodiment, the monitor circuit 38a is formed so as to cause a failure because of a similar factor attributable to the first clock signal CKa at an earlier time than in case that the buffer circuit 31a fails due to the electro-migration. In other words, the monitor circuit 38a is a monitor circuit for detecting a failure caused by the electro-migration and outputting a signal depending on the monitoring result. The determination circuit 39a determines, based on the output signal of the monitor circuit 38a, whether a failure has occurred in the monitor circuit 38a, and produces a first determination signal SJa depending on the determination result. The first determination signal SJa is used to predict the failure of the buffer circuit 31a and to predict the life of the buffer circuit 31a, i.e., the life of the main block 22a.

As further depicted in FIG. 2, the control circuit 24 produces the first control signal SC1 and the second control signal SC2 based on the first determination signal SJa output from the determination circuit 39a. For example, the control circuit 24 first operates the main block 22a. Then, the control circuit 24 predicts the occurrence of abnormality in the main block 22a based on the detection result of the detection circuit including the monitor circuit 38a and the determination circuit 39a, which are arranged in the main block 22a, and switches over the operating block from the main block 22a to the backup block 22b.

Thus, the life of the buffer circuit 31la for transmitting the clock signal CKa is predicted by arranging the monitor circuit 38a inside the main block 22a. The life of the function block 11 is prolonged by switching over the operating block from the main block 22a to the backup block 22b before a failure due to the electro-migration occurs in the buffer circuit 31a through which the clock signal CKa is transmitted.

As further depicted in FIG. 2, the backup block 22b includes a similar configuration to that of the main block 22a. For example, the backup block 22b includes a buffer circuit 31b, a plurality (three in the drawing) of flip-flops (hereinafter abbreviated to "FFs") 32b to 34b, processing circuits 35b to 37b, a monitor circuit 38b, and a determination circuit 39b. The configuration and the operation of each of the circuits 31b to 39b are, for example, similar to those of the corresponding circuits 31a to 39a in the main block 22a.

Accordingly, the detection circuit including the monitor circuit 38b and the determination circuit 39b, which are arranged in the backup block 22b, produces a determination signal SJb predicting a failure of the buffer circuit 31b inside the backup block 22b, i.e., the life of the backup block 22b. With, for example, the control circuit 24 outputting an abnormality signal based on the determination signal S1b, a semiconductor device to which the semiconductor device 10 is coupled may determine that the backup block 22b is at the end of the life, i.e., that the semiconductor device 10 is at the end of the life.

Exemplary configurations of the signal switching circuit 21, the buffer circuit 31a, and the monitor circuit 38a is described below.

Figure 3:
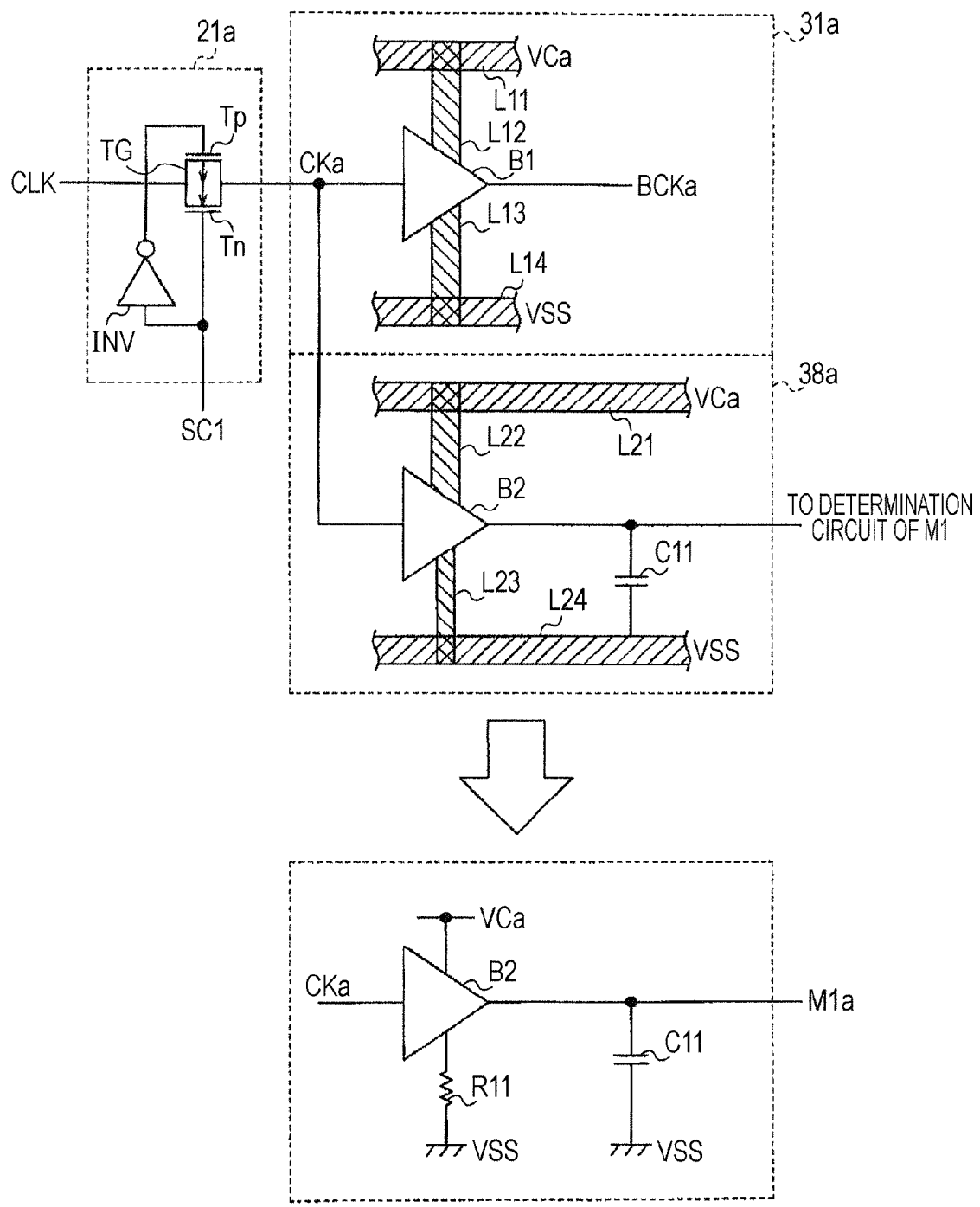
FIG. 3 depicts part of a main block in FIGS. 1A and 1B.

As depicted in FIG. 3, the signal switching circuit 21 includes a gate circuit 21a. The gate circuit 21a controls supply/stop of the clock signal to the main block 22a.

The clock signal CLK is supplied to a transfer gate TG of the gate circuit 21a. The transfer gate TG includes a pair of P-channel MOS transistor Tp and N-channel MOS transistor Tn which are coupled in parallel. The first control signal SC1 is supplied to a gate of the N-channel MOS transistor Tn and to an inverter circuit INV, and an output terminal of the inverter circuit INV is coupled to a gate of the P-channel MOS transistor Tp.

The gate circuit 21a outputs the first clock signal CKa upon both the transistors Tp and Tn being turned on respectively by the first control signal SC1 at a H-level and a L-level signal output from the inverter circuit INV. Further, the gate circuit 21a stops the outputting of the first clock signal CKa upon both the transistors Tp and Tn being turned off respectively by the first control signal SC1 at a L-level and a H-level signal output from the inverter circuit INV.

Additionally, the signal switching circuit 21 includes a gate circuit (not depicted) for controlling supply/stop of the clock signal to the backup block 22b. The not-depicted gate circuit includes, as in the gate circuit 21a, a transfer gate and an inverter circuit. The first control signal SC1 is supplied to a gate of a P-channel MOS transistor and the inverter circuit, which are included in the transfer gate, and an output signal of the inverter circuit is supplied to a gate of an N-channel MOS transistor. Thus, the not-depicted gate circuit 21a outputs the second clock signal CKb upon both the transistors being turned on respectively by the first control signal SC1 at a L-level and a H-level signal output from the inverter circuit, and stops the outputting of the second clock signal CKb upon both the transistors Tp and Tn being turned off respectively by the first control signal SC1 at a H-level and a L-level signal output from the inverter circuit.

As further depicted in FIG. 3, cell structures of the buffer circuit 31a and the monitor circuit 38a are schematically depicted in respective frames denoted by broken lines.

The buffer circuit 31a and the monitor circuit 38a are each stored as a cell in a library that is utilized to design a semiconductor device. In other words, the semiconductor device is designed by arranging the monitor circuit 38a in place, which is registered in the library. Unlike the case of arranging an ordinary buffer unit and coupling (wiring) lines to power supply lines L21 and L24, it is not necessary to reduce the widths of the former lines after coupling those lines. Accordingly, an increase in period of design for the semiconductor device is suppressed.

As further depicted in FIG. 3, the buffer circuit 31a includes a line L11 for supplying the drive voltage VCa, a line L14 for supplying the low voltage VSS, a buffer unit B1, a line L12 for coupling the power supply line L11 and the buffer unit B1, and a line L13 for coupling the power supply line L14 and the buffer unit B1. The buffer unit B1 delivers a current from its output terminal through the power supply line L11 and then the line L12 in response to the first clock signal CKa at a H-level, and draws a current to the power supply line L14 from its output terminal through the line L13 in response to the first clock signal CKa at a L-level. Accordingly, a current intermittently flows through the line L12 and the line L13 at time intervals corresponding to the cycle of the first clock signal CKa.

As further depicted in FIG. 3, the monitor circuit 38a includes a similar configuration to that of the buffer circuit 31a. For example, the monitor circuit 38a includes a line L21 for supplying the drive voltage VCa, a line L24 for supplying the low voltage VSS, a buffer unit B2, a line L22 for coupling the power supply line L21 and the buffer unit B2, and a line L23 for coupling the power supply line L24 and the buffer unit B2. The line L22 may be formed having a similar width as the line L12 in the buffer circuit 31a, while the line L23 is formed to include a width substantially narrower than that of the line L13 in the buffer circuit 31a. As a result, the line L23 in the monitor circuit 38a functions as a load element and has a higher resistance value than the line L13 in the buffer circuit 31a, i.e., provides a larger load than that applied to the buffer circuit 31a. A capacitor C11 having a capacity larger than a drive capacity of the buffer unit B1 in the buffer circuit 31a is coupled to the output terminal of the buffer unit B2.

Thus, as depicted in the lower side of FIG. 3, the monitor circuit 38a having the above-described configuration is equivalent to a circuit which provides the lower voltage VSS to the buffer unit B1 in the buffer circuit 31a through a resistor R11 and which includes a capacitor C11 coupled to the output terminal of the buffer unit B1.

As further depicted in FIG. 3, respective cells of the buffer circuit 31a in FIG. 3 and the monitor circuit 38a in FIG. 3 are formed in the semiconductor device 10 in FIG. 1. In the lines L12 and L13 in the buffer circuit 31a and the lines L22 and L23 in the monitor circuit 38a, the electro-migration occurs due to currents flowing through those lines, thus causing the lines to break. Because the line L23 in the monitor circuit 38a has a smaller allowable value with respect to current density than the line L13 in the buffer circuit 31a and the drive capacity of the buffer unit B2 is larger than that of the buffer unit B1, the line L23 breaks at an earlier time than the lines L12, L13 and L22. Thus, the monitor circuit 38a fails at an earlier time than the buffer circuit 31a. The buffer circuit 31a fails shortly after the failure of the monitor circuit 38a. In other words, the failure of the buffer circuit 31a is predicted from the failure of the monitor circuit 38a.

As further depicted in FIG. 3, in the state where lines L22 and L23 are not broken, a monitoring signal M1a output from the buffer unit B2 undergoes a clock operation of alternately repeating a H-level and a L-level at a similar cycle as the first clock signal CKa. If the line L23 breaks, the monitoring signal M1a is held at the H-level. The monitoring signal M1a is supplied to the determination circuit 39a.

As further depicted in FIG. 3, the determination circuit 39a determines whether the monitoring signal M1a undergoes the clock operation or it is held at the fixed level, and then outputs the first determination signal SJa.

Figure 4:
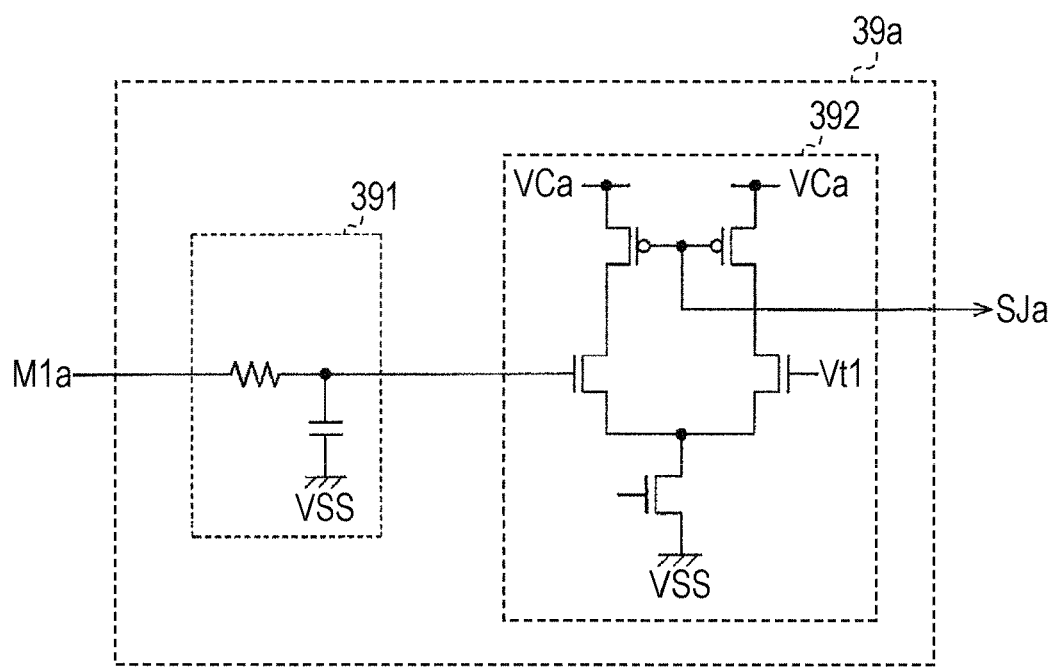
FIG. 4 depicts a determination circuit in FIG. 3.

As depicted in FIG. 4, the determination circuit 39a includes, for example, a filter circuit (e.g., an integral circuit) 391 for averaging a voltage level of the monitoring signal M1a, and a comparison circuit 392 for comparing an output signal level of the filter circuit 391 and a threshold voltage Vt1. The threshold voltage Vt1 is set to a value between the averaged voltage level of the monitoring signal M1a and the fixed voltage level of the monitoring signal M1a. If the output signal level of the filter circuit 391 is lower than the threshold voltage Vt1, the comparison circuit 392 determines that the monitoring signal M1a undergoes the clock operation, and then outputs the first determination signal SJa at a L-level. On the other hand, if the output signal level of the filter circuit 391 is higher than the threshold voltage Vt1, the comparison circuit 392 determines that the level of the monitoring signal M1a is held at the H-level, and then outputs the first determination signal SJa at a H-level.

As understood from the above description, the first embodiment provides the following advantages.

(1) The monitor circuit 38a for predicting the life of the buffer circuit 31a includes the line L21 for supplying the drive voltage VCa, the line L24 for supplying the low voltage VSS, the buffer unit B2, the line L22 for coupling the power supply line L21 and the buffer unit B2, and the line L23 for coupling the power supply line L24 and the buffer unit B2. The line L22 may be formed having a similar width as the line L12 in the buffer circuit 31a, while the line L23 is formed to include a width substantially narrower than that of the line L13 in the buffer circuit 31a. As a result, the line L23 in the monitor circuit 38a has a smaller allowable value with respect to current density than the line L13 in the buffer circuit 31a. Because the line L23 in the monitor circuit 38a has a smaller allowable value with respect to current density than the line L13 in the buffer circuit 31a and the drive capacity of the buffer unit B2 is larger than that of the buffer unit B1, the line L23 is caused to break at an earlier time than the lines L12, L13 and L22. Thus, the monitor circuit 38a fails at an earlier time than the buffer circuit 31a. The buffer circuit 31a fails shortly after the failure of the monitor circuit 38a. In other words, the failure of the buffer circuit 31a is predicted from the failure of the monitor circuit 38a.

(2) The monitor circuit 38a is arranged near the buffer circuit 31a of which life is to be predicted. Thus, a failure at the location where the buffer circuit 31a is arranged, i.e., a local failure, is detected by using the monitor circuit 38a, for example.

(3) The capacitor C11 having a capacity larger than the drive capacity of the buffer unit B1 in the buffer circuit 31a is coupled to the output terminal of the buffer unit B2. With the provision of the capacitor C11, a current is consumed in a larger amount by the buffer unit B2 in the monitor circuit 38a than by the buffer circuit 31a, and a larger current flows through the line L23 coupled to the buffer unit B2, thus making the line L23 more apt to break. In other words, a failure attributable to the electro-migration is detected by setting resistance of the monitor circuit 38a against the electro-migration to be smaller than that of the buffer circuit 31a.

(4) In the monitor circuit 38a, the buffer unit B2 to which the first clock signal CKa is input is coupled to the power supply lines L21 and L24 through the line L22 and the line L23, and the output signal of the buffer unit B2 is output as the monitoring signal M1a. Accordingly, if no failure occurs, the monitoring signal M1a undergoes the clock operation of cyclically changing a level. If the buffer unit B2 fails, i.e., if the line L23 breaks, the monitoring signal M1a is held at a constant level. As a result, a failure attributable to the electro-migration is more determined than the case of detecting a voltage change across a conductive pattern coupled between the power supply lines.

(5) The control circuit 24 predicts the occurrence of abnormality in the main block 22a based on the detection result of the detection circuit including the monitor circuit 38a and the determination circuit 39a which are arranged in the main block 22a, and switches over the operating block from the main block 22a to the backup block 22b. Thus, the life of the buffer circuit 31a for transmitting the clock signal CKa is predicted by arranging the monitor circuit 38a in the main block 22a. Further, the life of the function block 11 is prolonged by switching over the operating block from the main block 22a to the backup block 22b before a failure attributable to the electro-migration occurs in the buffer circuit 31a.

(6) In the monitor circuit 38a, the line L23 for coupling the buffer unit B2 and the line L24, which supplies the lower voltage VSS, may be set thinner than the line L13 in the buffer circuit 31a. With that setting, the line L23 is caused to break at an earlier time due to the electro-migration, and the monitoring signal M1a output from the buffer unit B2 is held at the H-level. Accordingly, the determination circuit 39a is just required to determine whether the monitoring signal M1a is held at the H-level. In other words, the failure attributable to the electro-migration is determined.

A second embodiment is described with reference to FIGS. 5 to 11. For the convenience of explanation, similar components to those in the foregoing embodiment are denoted by the similar reference numerals and a description of those components is omitted.

Figure 5:
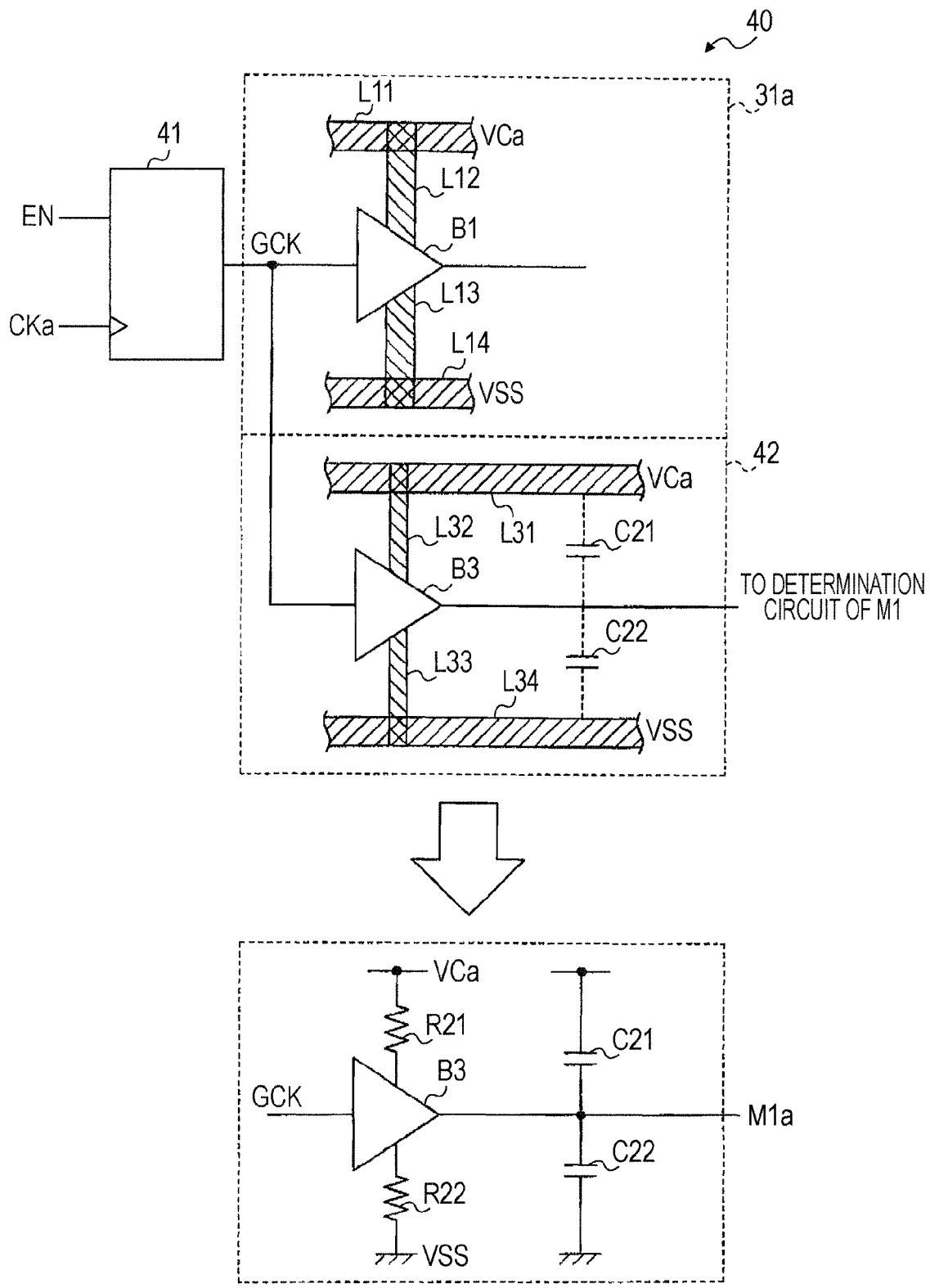
FIG. 5 depicts part of a main block in a second embodiment.

As depicted in FIG. 5, a main block 40 in this second embodiment includes a gate circuit 41 serving as a signal supplier. The first clock signal CKa and an enable signal EN are supplied to the gate circuit 41. In response to the enable signal EN, the gate circuit 41 controls supply and stop of a gate dock signal GCK with respect to the buffer circuit 31a, etc. In this second embodiment, the gate circuit 41 outputs the gate clock signal GCK, which is substantially similar to the clock signal CKa, in response to the enable signal EN at a H-level, and outputs the gate clock signal GCK at a L-level in response to the enable signal EN at a L-level. The gate clock signal GCK is supplied to the buffer circuit 31a and a monitor circuit 42.

As further depicted in FIG. 5, the buffer circuit 31a is a clock buffer and outputs the clock signal BCKa that is obtained by buffering the gate clock signal GCK. As described above, the gate clock signal GCK is output from the gate circuit 41. Accordingly, if the enable signal EN is at a H-level, the buffer circuit 31a outputs the clock signal BCKa to perform a switching operation. The clock signal BCKa brings various circuits of the main block 40 into an operating state. On the other hand, if the enable signal EN is at a L-level, the buffer circuit 31a outputs the clock signal BCKa at a L-level. Accordingly, each circuit supplied with the clock signal BCKa at the L-level comes into a standstill state and holds a signal. Power consumption by the circuit in the standstill state is smaller than that in the operating state. Thus, the enable signal EN at the L-level brings the main block 40 into a standstill state, i.e., inactivates the main block 40. As a result, the power consumption is reduced.

As further depicted in FIG. 5, the monitor circuit 42 includes a line L31 for supplying the drive voltage VCa, a line L34 for supplying the low voltage VSS, a buffer unit B3, a line L32 for coupling the power supply line L31 and the buffer unit B3, and a line L33 for coupling the power supply line L34 and the buffer unit B3. The lines L32 and the line L33 are formed to include widths substantially narrower than those of the lines L12 and L13 in the buffer circuit 31a. As a result, the line L32 and L33 in the monitor circuit 42 serve as load elements and include higher resistance values than the line L12 and L13 in the buffer circuit 31a, i.e., provide larger loads than those applied to the buffer circuit 31a. The buffer unit B3 may include a larger drive capacity than the buffer unit B1 in the buffer circuit 31a.

As depicted in the lower side of FIG. 5, the monitor circuit 42 having the above-described configuration is equivalent to a circuit which provides the drive voltage VCa and the lower voltage VSS to the buffer unit B1 in the buffer circuit 31a through resistors R21 and R22, and which includes capacitors C21 and C22 coupled to the output terminal of the buffer unit B1.

Respective cells of the buffer circuit 31a and the monitor circuit 42, each having the above-described configuration, are formed in the semiconductor device. In the lines L12 and L13 in the buffer circuit 31a and the lines L32 and L33 in the monitor circuit 42, the electro-migration occurs due to currents flowing through those lines, thus causing the lines to break. Because the lines L32 and L33 in the monitor circuit 40 include smaller allowable values with respect to current density than the lines L12 and L13 in the buffer circuit 31a and the drive capacity of the buffer unit B3 is larger than that of the buffer unit B1, the lines L32 and L33 break at an earlier time than the lines L12 and L13. Thus, the monitor circuit 42 fails at an earlier time than the buffer circuit 31a. The buffer circuit 31a fails shortly after the failure of the monitor circuit 42. In other words, the failure of the buffer circuit 31a is predicted from the failure of the monitor circuit 42.

In the state where lines L32 and L33 are not broken, a monitoring signal M1a output from the buffer unit B3 undergoes a clock operation of alternately repeating a H-level and a L-level at a similar cycle as the gate clock signal GCK. If the line L32 breaks, the monitoring signal M1a is held at the L-level, and if the line L33 breaks, the monitoring signal M1a is held at the H-level. The monitoring signal M1a is supplied to the determination circuit 43.

Figure 6:
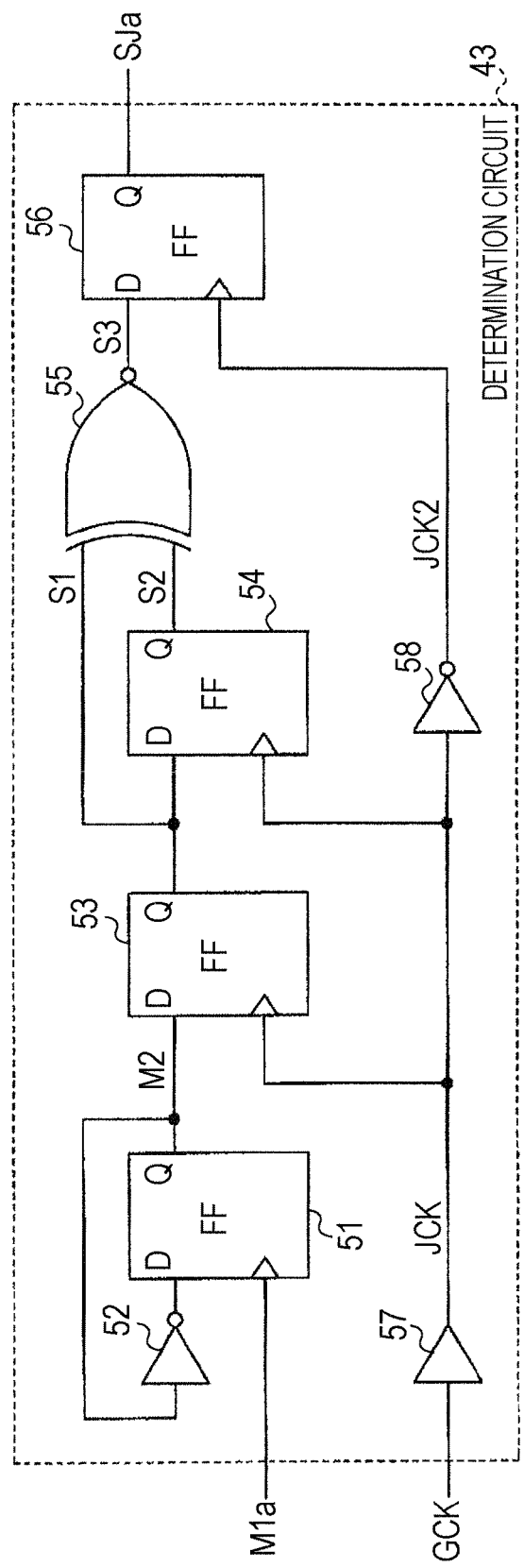
FIG. 6 depicts a determination circuit in FIG. 5.

As depicted in FIG. 6, the monitoring signal M1a and the gate clock signal GCK are input to the determination circuit

43. The monitoring signal M1*a* is supplied to a clock input terminal of an FF 51. A non-inverted output terminal Q of the FF 51 is coupled to an input terminal of an inverter circuit 52, and an output terminal of the inverter circuit 52 is coupled to an input terminal D of the FF 51. Further, the output terminal Q of the FF 51 is coupled to an input terminal D of an FF 53.

A non-inverted output terminal Q of the FF 53 is coupled to an input terminal D of an FF 54 and is further coupled to one input terminal of an exclusive NOR (ExNOR) circuit 55. The other input terminal of the ExNOR circuit 55 is coupled to a non-inverted output terminal Q of the FF 54. An output terminal of the ExNOR circuit 55 is coupled to an input terminal of an FF 56.

The gate clock signal GCK is supplied to a buffer circuit 57. An output terminal of the buffer circuit 57 is coupled to dock input terminals of the FFs 53 and 54 and is further coupled to an input terminal D of an inverter circuit 58. An output terminal of the inverter circuit 58 is coupled to a clock input terminal of the FF 56. The first determination signal SJa is output from a non-inverted output terminal Q of the FF 56.

In the determination circuit 43, the buffer circuit 57 outputs a clock signal ICK that is obtained by buffering the gate clock signal GCK, and the inverter circuit 58 outputs a clock signal JCK2 that is obtained by logically inverting the clock signal JCK.

The operations of the gate circuit 41, the monitor circuit 42, and the determination circuit 43 is described below.

Figure 7:
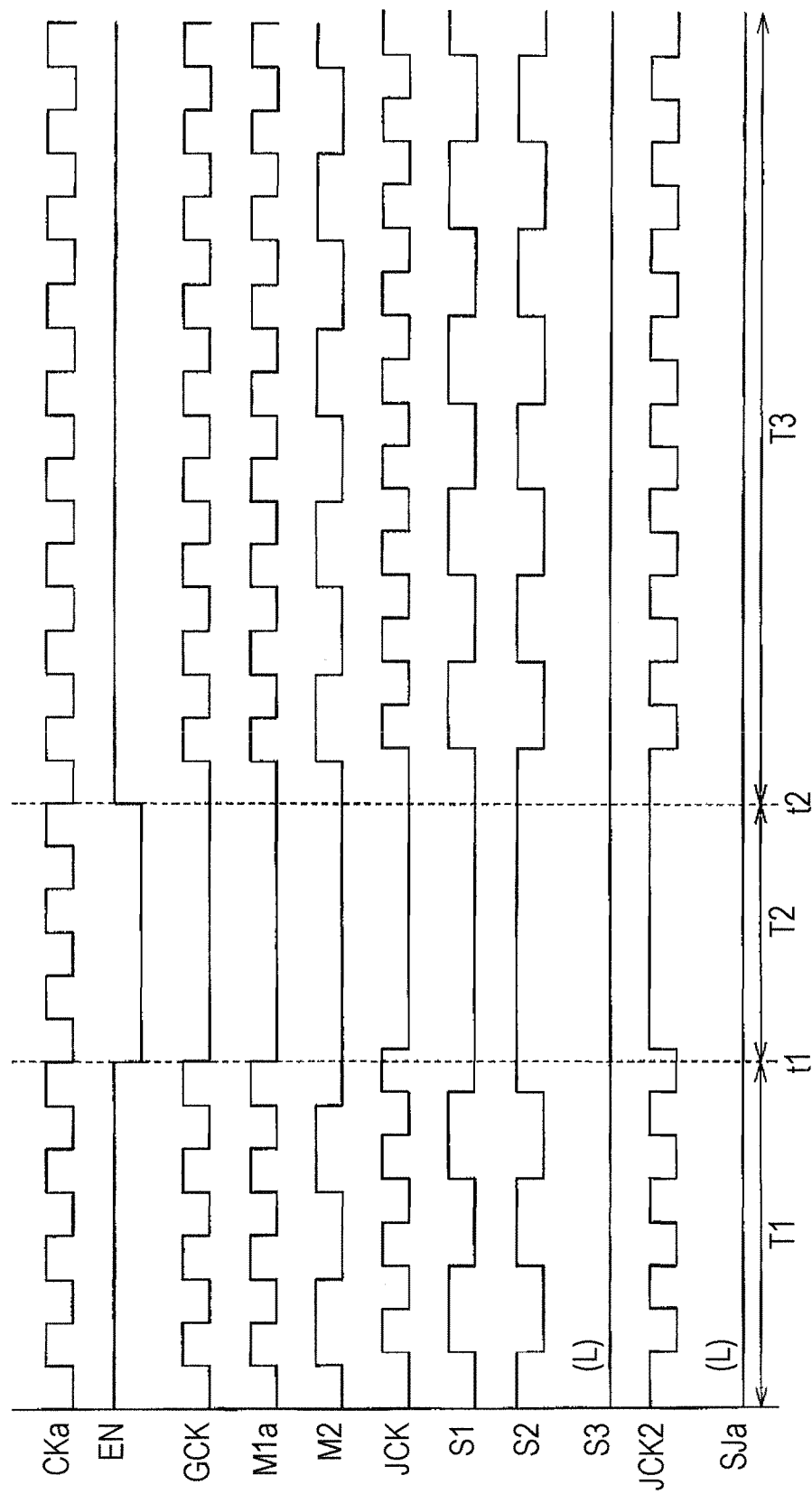
FIG. 7 depicts operation waveforms of a monitor circuit in FIG. 5 and the determination circuit in FIG. 5 in case that the monitor circuit operates normally.

FIG. 7 depicts operation waveforms of the monitor circuit in FIG. 5 and the determination circuit in FIG. 5 when the monitor circuit operates normally. As depicted in FIG. 7, when the enable signal EN is at the H-level (periods T1 and T3), the gate circuit 41 outputs the gate clock signal GCK that is similar to the first clock signal CKa. The monitor circuit 42 outputs the monitoring signal M1*a* undergoing the clock operation, which is similar to the gate clock signal GCK.

The FF 51 outputs a signal M2 resulting from dividing the frequency of the monitoring signal M1*a* by two. The FF 53 outputs a signal S1 having a similar level as the signal M2 in sync with the rising edge of the clock signal JCK. The FF 54 outputs a signal S2 having the similar level as the signal S1 in sync with the rising edge of the clock signal JCK. As a result, the signals S1 and S2 of which levels are changed in a complementary relation are input to the ExNOR circuit 55. Accordingly, the ExNOR circuit 55 outputs a signal S3 at a L-level. The FF 56 outputs the first determination signal SJa having a similar level as the signal S3, i.e., having the L-level, in sync with the rising edge of the clock signal JCK2.

If the enable signal EN is at the L-level (period T2), the gate circuit 41 outputs the gate clock signal GCK at the L level. Therefore, the output signal M1*a* of the monitor circuit 42 and the output signals M2, S1, S2 and S3 of the various circuits included in the determination circuit 43 are held at the L-level or the H-level. Because combination of logical levels of the output signal S1 and the output signal S2 is either (S1=H-level and S2=L-level) or (S1=L-level and S2=H-level), the FF 56 outputs the first determination signal SJa at the L-level.

Figure 8:
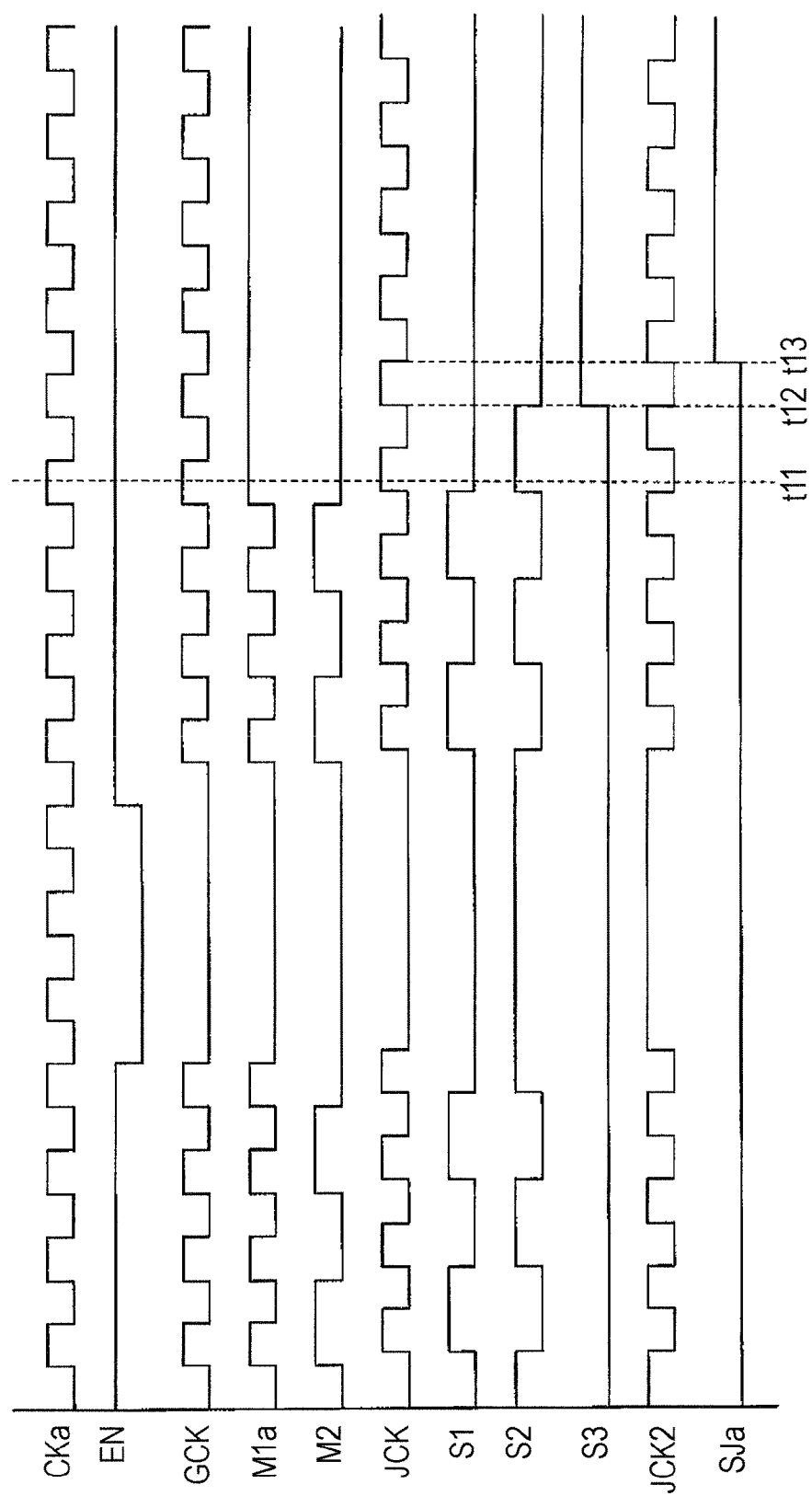
FIG. 8 depicts operation waveforms of the monitor circuit in FIG. 5 and the determination circuit in FIG. 5 in the first case where the monitor circuit has failed.

FIG. 8 depicts operation waveforms of the monitor circuit in FIG. 5 and the determination circuit in FIG. 5 in the first case where the monitor circuit has failed. As depicted in FIG. 8, if the line L33 (see FIG. 5) breaks at a time t11, the monitoring signal M1*a* of the monitor circuit 42 is held at the H-level. At that time, the FF 51 outputs the signal M2 at the L-level. Further, the FF 53 outputs the signal S1 at the L-level, and the FF 54 outputs the signal S2 at the H-level. Therefore, the FF 53 outputs the signal S2 at the L-level, which is similar to the signal S1 at the L-level, in sync with a next rising edge (time t12) of the clock signal JCK. As a result, the ExNOR circuit 55 outputs the signal S3 at the H-level. Further, the FF 56 outputs the first determination signal SJa at the H-level in sync with a next rising edge (time t13) of the clock signal JCK2.

Figure 9:
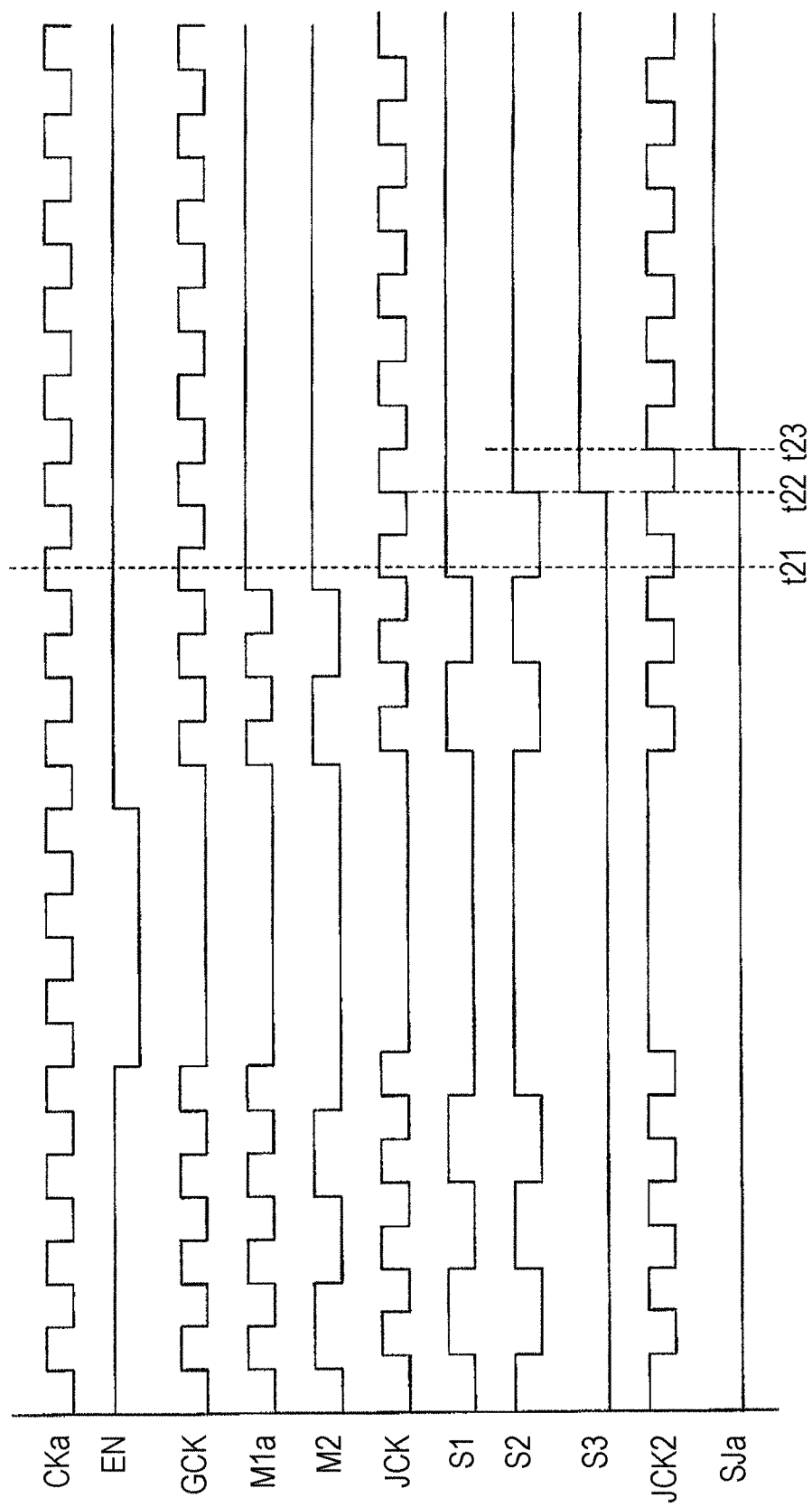
FIG. 9 depicts operation waveforms of the monitor circuit in FIG. 5 and the determination circuit in FIG. 5 in the second case where the monitor circuit has failed.

FIG. 9 depicts operation waveforms of the monitor circuit in FIG. 5 and the determination circuit in FIG. 5 in the second case where the monitor circuit has failed. As depicted in FIG. 9, if the line L33 (see FIG. 5) breaks at a time t21, the monitoring signal M1*a* of the monitor circuit 42 is held at the H-level. At that time, the FF 51 outputs the signal M2 at the H-level. Further, the FF 53 outputs the signal S1 at the H-level, and the FF 54 outputs the signal S2 at the L-level. Therefore, the FF 53 outputs the signal S2 at the H-level, which is similar to the signal S1 at the H-level, in sync with a next rising edge (time t22) of the clock signal JCK. As a result, the ExNOR circuit 55 outputs the signal S3 at the H-level. Further, the FF 56 outputs the first determination signal S1*a* at the H-level in sync with a next rising edge (time t23) of the clock signal JCK2.

FIG. 10 depicts operation waveforms of the monitor circuit in FIG. 5 and the determination circuit in FIG. 5 in the third case where the monitor circuit has failed. As depicted in FIG. 10, if the line L32 (see FIG. 5) breaks at a time t31, the monitoring signal M1*a* of the monitor circuit 42 is held at the L-level. At that time, the FF 51 outputs the signal M2 at the H-level. Further, the FF 53 outputs the signal S1 at the H-level, and the FF 54 outputs the signal S2 at the L-level. Therefore, the FF 53 outputs the signal S2 at the H-level, which is similar to the signal S1 at the H-level, in sync with a next rising edge (time t32) of the clock signal JCK. As a result, the ExNOR circuit 55 outputs the signal S3 at the H-level. Further, the FF 56 outputs the first determination signal SJa at the H-level in sync with a next rising edge (time t33) of the clock signal JCK2.

FIG. 11 depicts operation waveforms of the monitor circuit in FIG. 5 and the determination circuit in FIG. 5 in the fourth case where the monitor circuit has failed. As depicted in FIG. 11, if the line L32 (see FIG. 5) breaks at a time t41, the monitoring signal M1*a* of the monitor circuit 42 is held at the L-level. At that time, the FF 51 outputs the signal M2 at the L-level. Further, the FF 53 outputs the signal S1 at the L-level, and the FF 54 outputs the signal S2 at the H-level. Therefore, the FF 53 outputs the signal S2 at the L-level, which is similar to the signal S1 at the L-level, in sync with a next rising edge (time t42) of the clock signal JCK. As a result, the ExNOR circuit 55 outputs the signal S3 at the H-level. Further, the FF 56 outputs the first determination signal SJa at the H-level in sync with a next rising edge (time t43) of the clock signal JCK2.

Thus, in any of the above-described first to fourth cases, the determination circuit 43 outputs the first determination signal SJa at the H-level. For example, in case that the monitor circuit 42 operates normally, the determination circuit 43 outputs the first determination signal SJa at the L-level. If the monitor circuit 42 fails, the determination circuit 43 outputs the first determination signal SJa at the H-level regardless of the failed location (line L32 or L33) and regardless of the timing of the failure. Therefore, the failure of the monitor circuit 42, i.e., the life of the buffer circuit 31*a*, is detected based on the first determination signal SJa.

As understood from the above description, the second embodiment provides the following advantages.

(1) The determination circuit 43 determines, based on the monitoring signal M1*a* and the gate clock signal GCK, whether the monitoring signal M1*a* is held at the H-level or the L-level. If the first clock signal CKa is not supplied, the monitoring signal M1*a* is held at the L-level and the gate clock signal GCK is also held at the L-level at a similar time. Thus, the occurrence of false determination is prevented by discriminately determining the case in which the level of the monitoring signal M1a is held because the first clock signal CKa (gate clock signal GCK) is not supplied, and the case in which the level of the monitoring signal M1a is held due to a failure caused by the electro-migration.

(2) The monitor circuit 42 includes the buffer unit B3 and the lines L32 and L33 for coupling the power supply lines L31 and L34 to the buffer unit B3, respectively. The lines L32 and L33 are formed to include substantial widths narrower than those of the lines L12 and L13 in the buffer circuit 31a. As a result, the lines L32 and L33 in the monitor circuit 42 include larger resistance values than the lines L12 and L13 in the buffer circuit 31a. The buffer unit B3 may be set to include a larger drive capacity than the buffer unit B1 in the buffer circuit 31a. Thus, one of the lines L32 and L33 is caused to break at an earlier time due to the electro-migration. If the line L32 breaks, the monitoring signal M1a is held at the L-level, and if the line L33 breaks, the monitoring signal M1a is held at the H-level. However, the determination circuit 43 outputs the first determination signal SJa at the H-level regardless of which one of the lines L32 and L33 is broken. Accordingly, the control circuit 24 is just required to determine whether the first determination signal SJa is held at the H-level, In other words, the failure attributable to the electro-migration is determined.

A third embodiment is described with reference to FIGS. 12A and 12B. For the convenience of explanation, similar components to those in the foregoing embodiments are denoted by similar reference numerals and a description of those components is omitted.

Figure 12A:
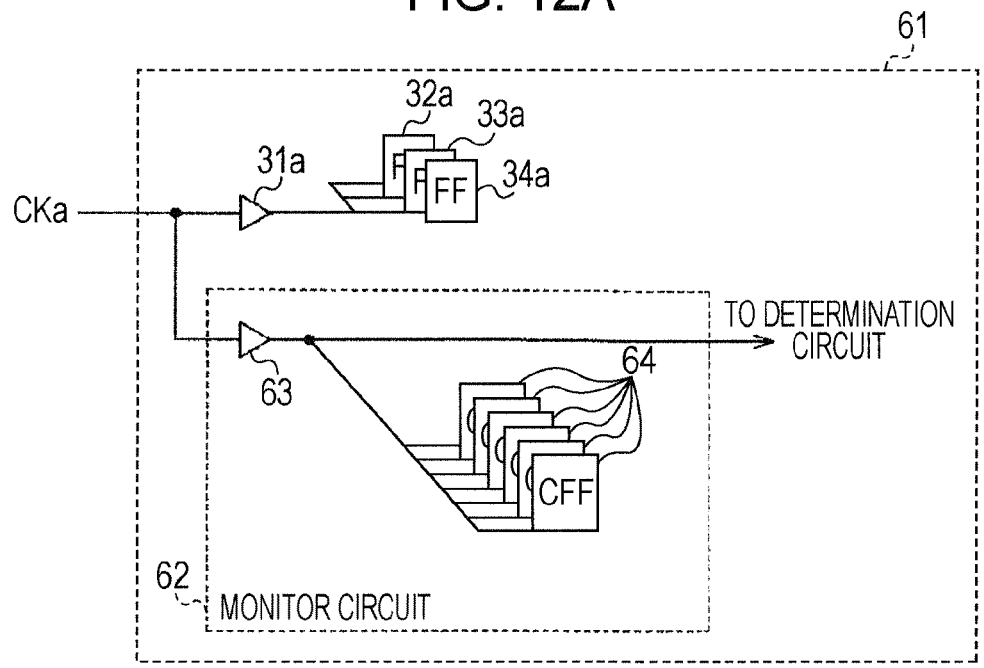
FIGS. 12A and 12B depict part of a main block in a third embodiment.

As depicted in FIG. 12A, a function block of the semiconductor device includes a main block 61 and a backup block (not depicted) having a similar configuration as the main block 61. A monitor circuit 62 in the main block 61 includes a buffer circuit 63 to which the clock signal CKa is input, and a plurality (six in the drawing) of load circuits 64 (denoted by CFF in the drawing) which are coupled to an output terminal of the buffer circuit 63. The load circuits 64 may be circuits including elements which are similar to clock drive units for FFs 32a to 34a coupled to the buffer circuit 31a.

As further depicted in FIG. 12A, the load circuits 64 are stored, along with the buffer circuits 31a and 63 and the FFs 32a to 34a, in a library of a design device that is used to design a semiconductor device. In other words, the semiconductor device is designed by arranging the load circuits 64 in place, which are registered in the library. Unlike the case of arranging ordinary FFs, there it is not necessary to eliminate undesired portions after arranging the FFs. Accordingly, an increase in period of design for the semiconductor device is suppressed.

Figure 12B:
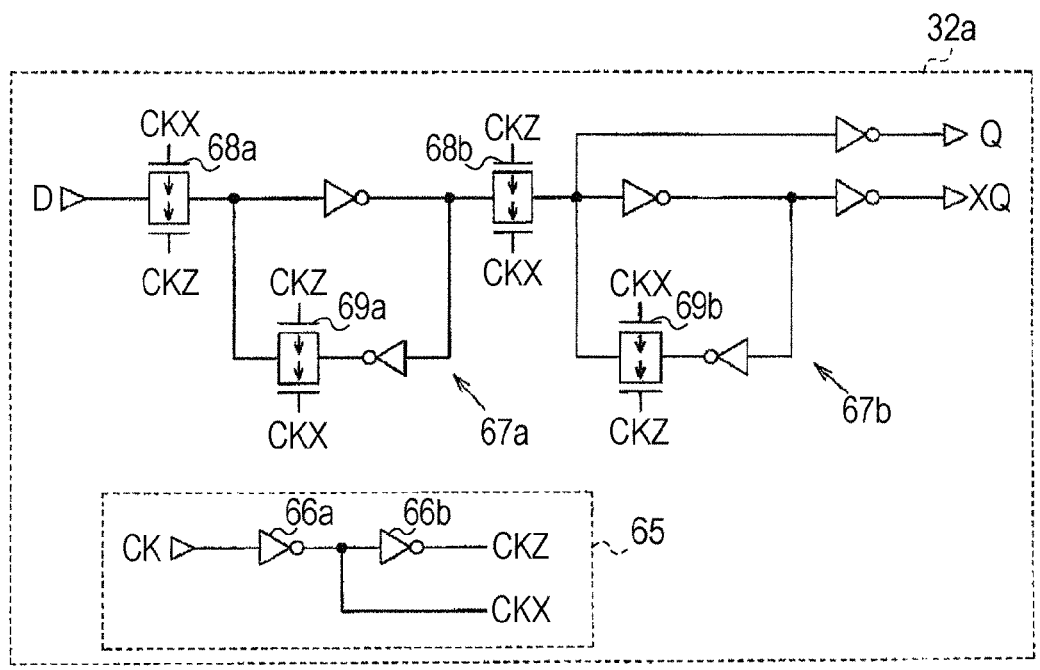

FIG. 12B depicts one example of the circuit configuration of the FF 32a. A clock drive unit 65 in the FF 32a produces complementary clock signals CKZ and CKX from the clock signal CK by using two inverter circuits 66a and 66b which are coupled in series. The clock signals CKZ and CKX control transfer gates 68a and 68b which are coupled respectively to the input sides of two latch sections 67a and 67b, and further control transfer gates 69a and 69b which are disposed respectively in the latch sections 67a and 67b.

Similar to the clock drive unit 65 depicted in FIG. 12B, each of the load circuits 64 includes two inverter circuits coupled in series. Therefore, one load circuit 64 has a drive capacity equal to that of the clock drive unit in one FF 32a. In other words, a plurality of FFs may be coupled for applying, to the buffer circuit 63, a drive load larger than that applied to the buffer circuit 31a of which life is to be predicted.

On the other hand, because an area occupied by one load circuit 64, i.e., an area for forming one load circuit 64, is equal to an area for forming two inverter circuits, the area occupied by one load circuit 64 is much smaller than an area occupied by the FF 32a including the clock drive unit 65. Therefore, an area of the monitor circuit 62 is reduced in comparison with the case in which the FF is coupled to the buffer circuit 63 for applying, to the buffer circuit 63, a drive load larger than that applied to the buffer circuit 31a of which life is to be predicted. Conversely, a plurality of load circuits 64 may be formed in an area for forming one FF. Stated another way, the use of the load circuits 64 enables a larger drive load than that of the FF to be applied to the buffer circuit 63 on condition of, for example, the similar area. Further, the use of the load circuits 64 suppresses an increase in area of the semiconductor device, which is resulted from adding the monitor circuit 62.

As understood from the above description, the third embodiment provides the following advantages.

(1) Since the load circuits 64 are used to increase the load of the buffer circuit 63 in the monitor circuit 62 in comparison with the load applied to the buffer circuit 31a of which life is to be predicted, a larger drive load than that provided by using FFs is applied to the buffer circuit 63 on condition of, for example, the similar area. Further, an increase in area of the semiconductor device, which is resulted from adding the monitor circuit 62, is suppressed.

(2) The load circuits 64 are stored, along with the buffer circuits 31a and 63 and the FFs 32a to 34a, in a library of a design device that is utilized to design a semiconductor device. In other words, the semiconductor device is designed by arranging the load circuits 64 in place, which are registered in the library. Unlike the case of arranging ordinary FFs, there it is not necessary to eliminate undesired portions after arranging the FFs. Accordingly, an increase in period of design for the semiconductor device is suppressed.

A fourth embodiment is described with reference to FIGS. 13 to 15. For the convenience of explanation, similar components to those in the foregoing embodiments are denoted by similar reference numerals and a description of those components is omitted.

Figure 13:
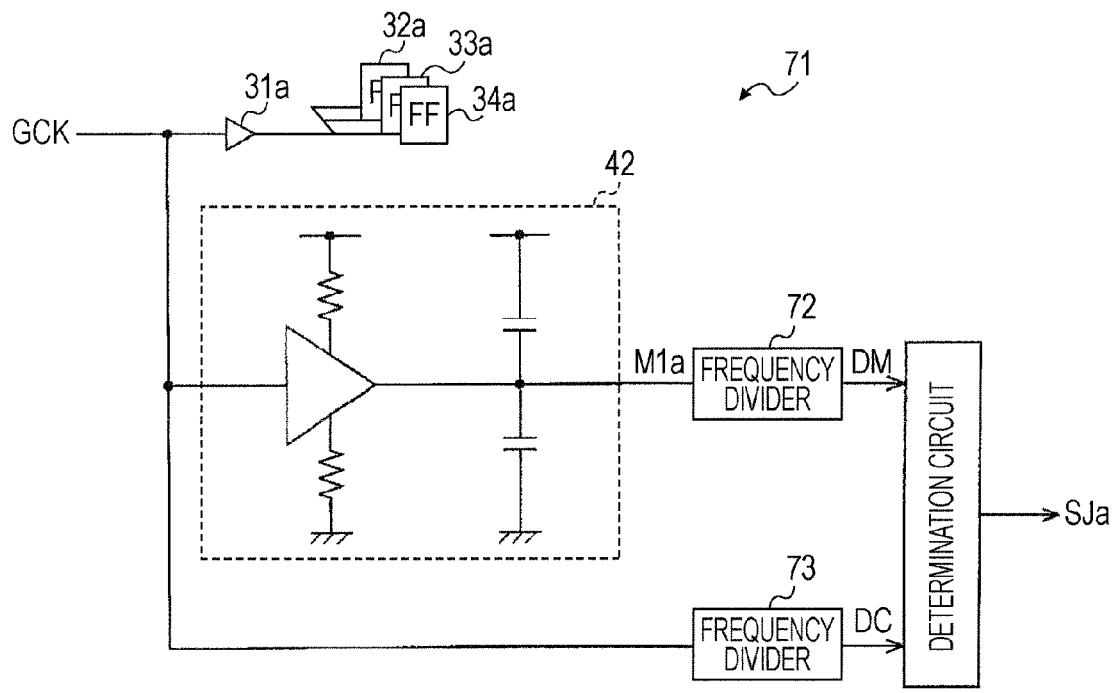
FIG. 13 depicts part of a main block in a fourth embodiment.

As depicted in FIG. 13, a function block of the semiconductor device includes a main block 71 and a backup block (not depicted) having a similar configuration as the main block 71. The main block 71 includes first and second frequency dividers 72 and 73. The first frequency divider 72 may be set to a similar frequency division ratio (e.g., division into ½ frequency) as the second frequency divider 73.

Figure 14:
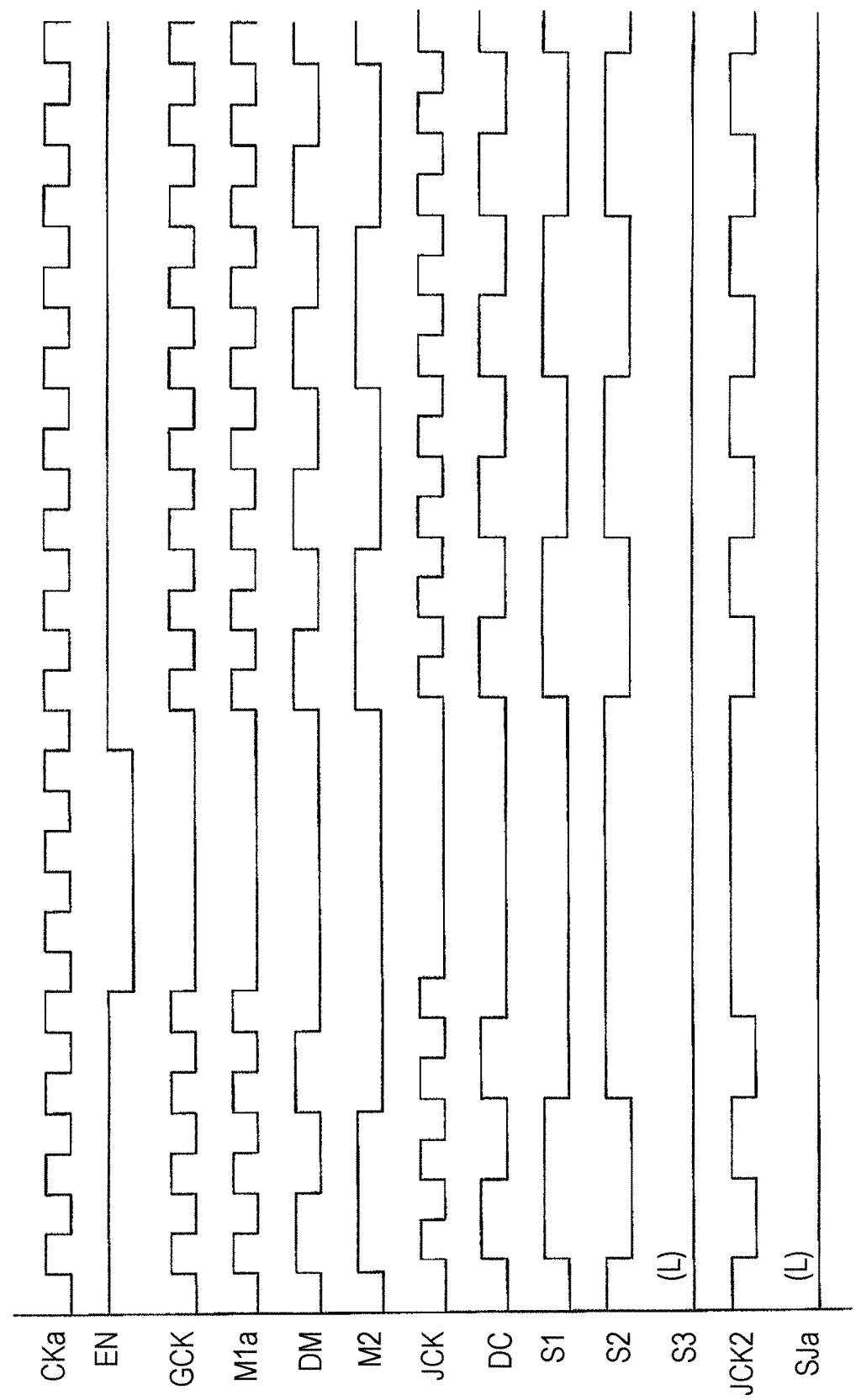
FIG. 14 depicts one example of operation waveforms of a monitor circuit and a determination circuit, in FIG. 13, related to the fourth embodiment.

As depicted in FIG. 14, the first frequency divider 72 outputs a frequency-divided monitoring signal DM resulting from dividing the frequency of the monitoring signal M1a that is output from the monitor circuit 42. The second frequency divider 73 outputs a frequency-divided clock signal DC resulting from dividing the frequency of the gate clock signal GCK. The frequency-divided monitoring signal DM and the frequency-divided clock signal DC are supplied to the determination circuit 43. As in the second embodiment, the determination circuit 43 produces the first determination signal SJa based on the frequency-divided monitoring signal DM and the frequency-divided clock signal DC.

As further depicted in FIG. 14, in the determination circuit 43, there occurs a general phenomenon that a current flows in the switching operation in which a signal level is alternately changed. An amount of current flowing with the switching operation in the determination circuit 43 in the fourth embodiment, which is supplied with the frequency-divided monitoring signal DM and the frequency-divided clock signal DC, is smaller than an amount of current flowing through the determination circuit 43 in the second embodiment. Accordingly, comparing the power consumption of the determination circuit 43 in the second embodiment with a total value of power consumptions of the frequency dividers 72 and 73 and the determination circuit 43 in the fourth embodiment, the power consumption in the fourth embodiment is smaller than that in the second embodiment. In other words, the power consumption is reduced by including the frequency dividers 72 and 73 and reducing the respective frequencies of the monitoring signal and the clock signal both supplied to the determination circuit 43.

In general, switching noise is generated by the switching operation in which a signal level is alternately changed. By including the frequency dividers 72 and 73 and reducing the respective frequencies of the monitoring signal and the clock signal both supplied to the determination circuit 43 as in the fourth embodiment, the number of times of switching operations per unit time is decreased. As a result, the generated switching noise is reduced.

The determination circuit 43 in the fourth embodiment produces various signals similarly to the determination circuit 43 in the first embodiment.

Figure 15:
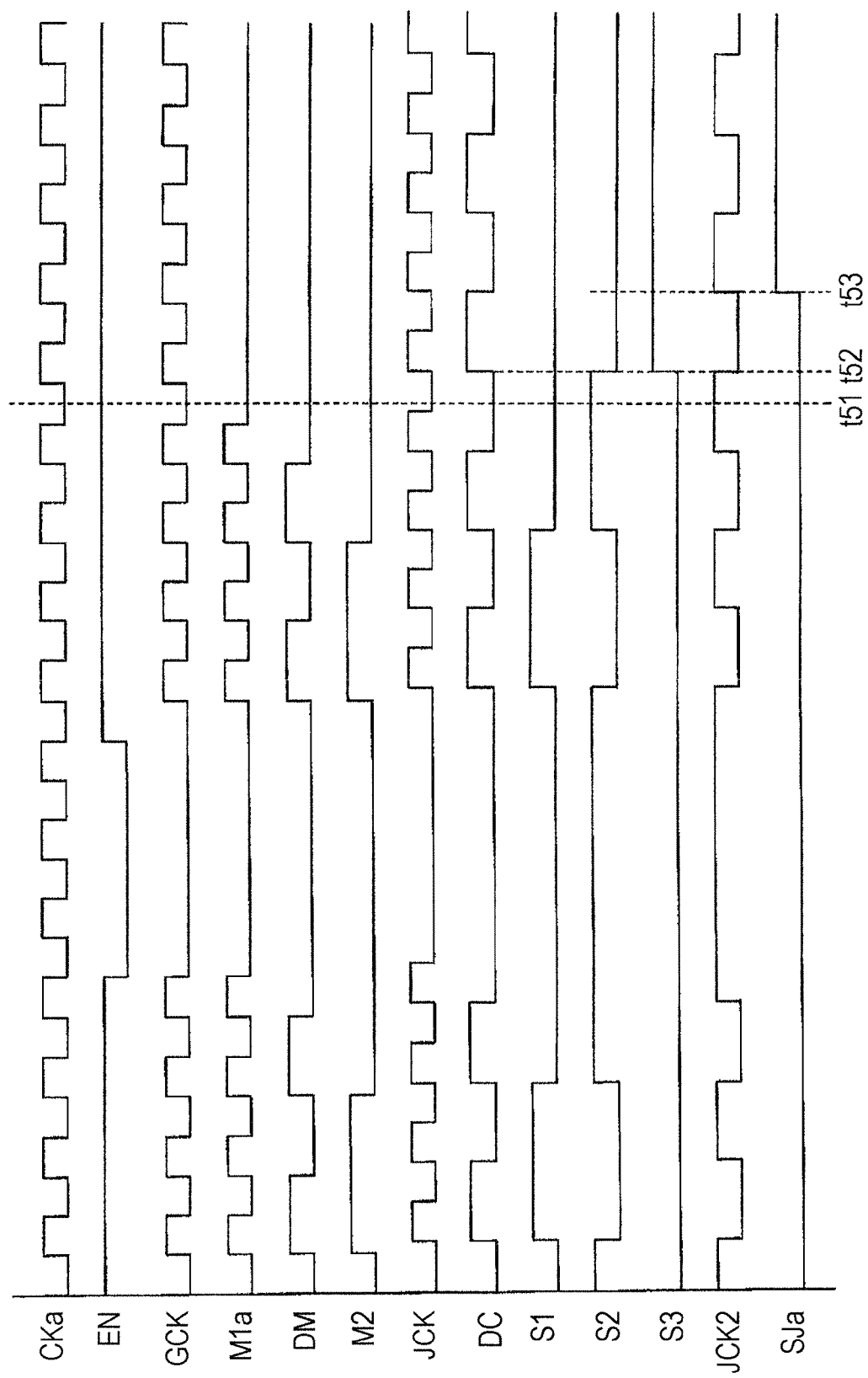
FIG. 15 depicts another example of the operation waveforms of the monitor circuit and the determination circuit, in FIG. 13, related to the fourth embodiment.

As depicted in FIG. 15, for example, if the line L32 (see FIG. 5) breaks at a time t51 similar to the fourth case in the first embodiment, the monitoring signal M1a of the monitor circuit 42 is held at the L-level. The determination circuit 43 produces the signal S2 at the L-level, which is similar to the signal S1 at the L-level, and then produces the signal S3 at the H-level in sync with a next rising edge (time t52) of the clock signal JCK. Further, the determination circuit 43 produces the first determination signal SJa at the H-level in sync with a next rising edge (time t53) of the clock signal JCK2.

As further depicted in FIG. 15, in the other cases, the determination circuit 43 operates similarly to the determination circuit 43 in the second embodiment and produces the first determination signal SJa. The determination circuit 43 in the fourth embodiment differs in signal cycle from the determination circuit 43 in the second embodiment. Accordingly, in the fourth embodiment, if the monitor circuit 42 fails, the determination circuit 43 outputs the first determination signal SJa at the H-level regardless of the failed location and regardless of the timing of the failure, as in the second embodiment. Thus, the failure of the monitor circuit 42, i.e., the life of the buffer circuit 31a, is detected based on the first determination signal SJa.

As understood from the above description, the fourth embodiment provides the following advantages.
(1) Since the frequency dividers 72 and 73 are included to reduce the respective frequencies of the monitoring signal and the clock signal both supplied to the determination circuit 43, the power consumption is reduced.
(2) Since the frequency dividers 72 and 73 are included to reduce the respective frequencies of the monitoring signal and the clock signal both supplied to the determination circuit 43, the number of times of switching operations per unit time is decreased and the switching noise is reduced.

A fifth embodiment is described with reference to FIG. 16. For the convenience of explanation, similar components to those in the foregoing embodiments are denoted by the similar reference numerals and a description of those components is omitted.

Figure 16:
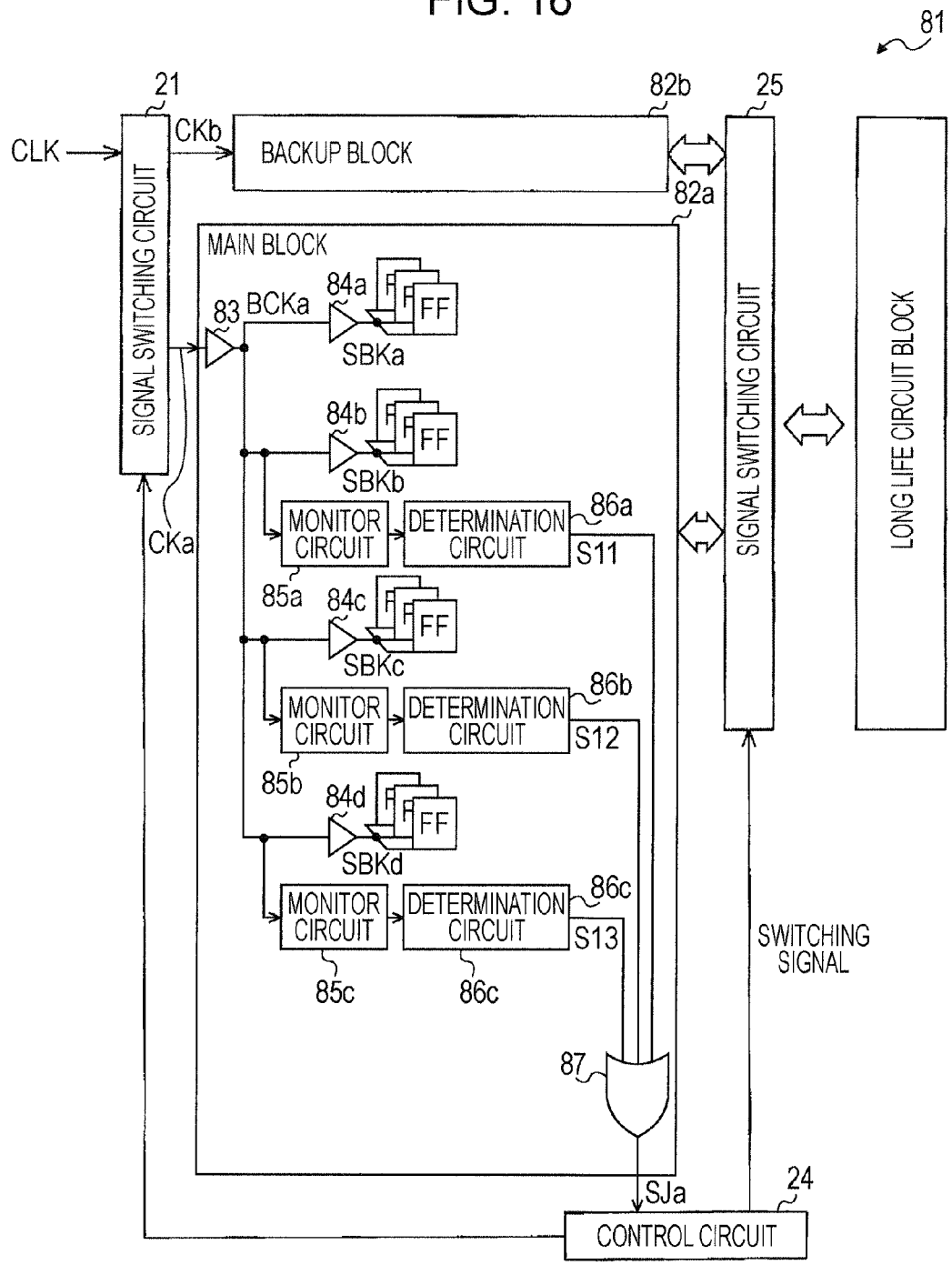
FIG. 16 depicts part of a semiconductor device related to a fifth embodiment.

As depicted in FIG. 16, a function block 81 in the fifth embodiment includes a main block 82a and a backup block 82b having the similar configuration as the main block 82a. A main buffer circuit 83 in the main block 82a is a clock buffer and outputs a clock signal BCKa, which is obtained by buffering a first clock signal CKa output from the signal switching circuit 21, to a plurality (four in the drawing) of sub-buffer circuits 84a to 84d. The sub-buffer circuits 84a to 84d output respectively sub-clock signals SBKa to SBKd that are obtained by buffering the clock signal BCKa.

There is a limitation on the number of input terminals of logic circuits (i.e., fan-out), which may be driven by an output of one logic circuit. In view of that any of logic circuits (FFs) in the main block 82a is not driven because of such a limitation, the main buffer circuit 83 in the fifth embodiment is branched to plural stages of buffer circuits. Stated another way, the plurality of sub-buffer circuits 84a to 84d are coupled to an output terminal of the main buffer circuit 83 to increase the substantial fan-out such that the clock signals are supplied to many logic circuits (FFs in the drawing) included in the main block 82a.

As further depicted in FIG. 16, in the main block 82a including many logic circuits, i.e., in the main block 82 having a large circuit scale, the buffer circuits 83 and 84a to 84d are subjected to differences in physical factors, such as a power distribution, temperature, and other externally applied influences, and the lives of the buffer circuits 83 and 84a to 84d differ from one another due to those differences. In other words, the plural buffer circuits 83 and 84a to 84d include different lives even when used to buffer the clock signals having a similar frequency. The life of the semiconductor device is determined by the buffer circuit that fails at the earliest time. Thus, the life of the semiconductor device is determined by the buffer circuit having the shortest life.

In the main block 82a, therefore, monitor circuits 85a to 85c and determination circuits 86a to 86c are arranged near some of the plural buffer circuits 83 and 84a to 84d, i.e., the sub-buffer circuits 84b to 84d, which include shorter lives as a result of, e.g., a temperature distribution analysis and a power analysis based on simulation, or which include failed as a result of accelerated life tests made on samples. The monitor circuits 85a to 85c include a similar configuration as the above-described monitor circuit 42 (see FIG. 5) and output respective monitoring signals. The determination circuits 86a to 86c include a similar configuration as the above-described determination circuit 43 (see FIG. 6) and produce, based on the monitoring signals, failure detection signals S11 to S13 depending on the states of the monitor circuits 85a to 85c. The failure detection signals S11 to S13 are output to an OR circuit 87. The OR circuit 87 takes the logical sum (OR) of the plural failure detection signals S11 to S13, thereby producing one first determination signal SJa.

As further depicted in FIG. 16, the control circuit 24 switches over the supply destination of the clock signal CLK and the drive voltage VCC from the main block 82a to the backup block 82b based on the first determination signal S1a that is output from the OR circuit 87.

As understood from the above description, the fifth embodiment provides the following advantages.
(1) In the main block 82a, the monitor circuits 85a to 85c and the determination circuits 86a to 86c are arranged near some of the plural buffer circuits 83 and 84a to 84d, i.e., the sub-buffer circuits 84b to 84d, which include been determined to include shorter lives as a result of, e.g., a temperature distribution analysis and a power analysis based on simulation, or which include failed as a result of accelerated life tests made on samples. The OR circuit 87 takes the logical sum (OR) of the plural failure detection signals S11 to S13 output respectively from the plural determination circuits 86a to 86c, thereby producing one first determination signal SJa. Thus, the control circuit 24 switches over the operating block from the main block 82a to the backup block 82b depending on one of the plural buffer circuits 83 and 84a to 84d, which fails at the earliest time. Accordingly, the switching-over from the main block 82a to the backup block 82b is reliably performed even in case that the buffer circuits 84b to 84d operate under different or varying conditions.

A sixth embodiment is described with reference to FIGS. 17 to 21. For the convenience of explanation, similar components to those in the foregoing embodiments are denoted by similar reference numerals and a description of those components is omitted.

Figure 17:
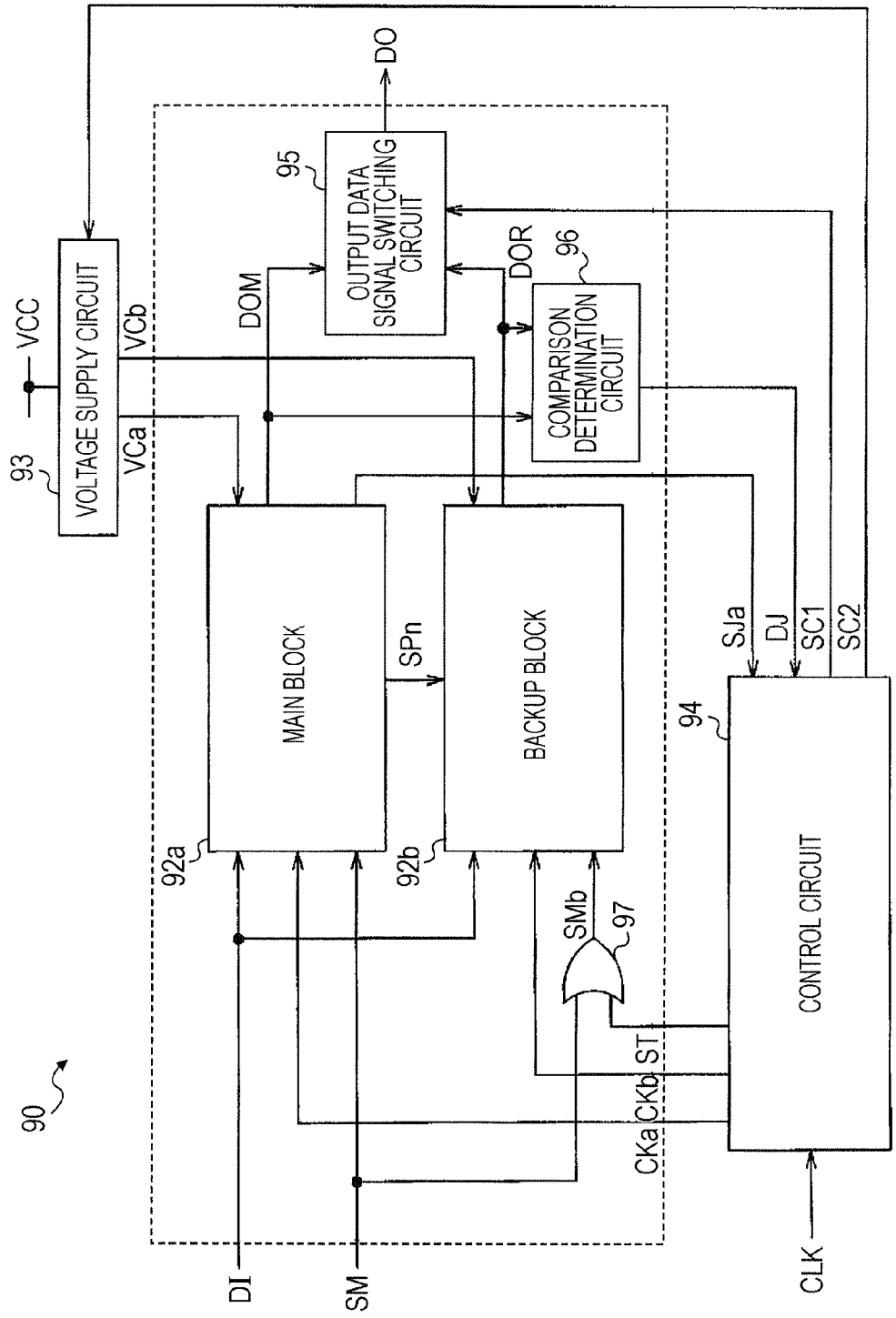
FIG. 17 depicts part of a semiconductor device related to a sixth embodiment.

As depicted in FIG. 17, a function block 90 of the semiconductor device includes a main block 92a and a backup block 92b each serving as a sub-block, a voltage supply circuit 93, a control circuit 94, an output data signal switching circuit 95, a comparison determination circuit 96, and an OR circuit 97.

As further depicted in FIG. 17, the clock signal CLK is input to the control circuit 94. Further, a failure determination signal SJa from a determination circuit included in the main block 92a and a signal determination signal DJ from the comparison determination circuit 96 are input to the control circuit 94. The control circuit 94 supplies a first clock signal CKa and a second clock signal CKb, which are substantially similar to the clock signal CLK, to the main block 92a and the backup block 92b, respectively. Further, in response to the failure determination signal SJa and the signal determination signal DJ, the control circuit 94 controls supply/stop of the first clock signal CKa and the second clock signal CKb. Thus, the control circuit 94 in this sixth embodiment includes the function of a signal switching circuit.

For example, the control circuit 94 first supplies the first clock signal CKa, which is substantially similar to the clock signal CLK, to the main block 92a. In case that the failure determination signal SJa at a given level is input, the control circuit 94 supplies the second clock signal CKb, which has been produced from the clock signal CLK, to the backup block 92b. Further, in case that the signal determination signal DJ at a given level is input, the control circuit 94 stops the supply of the first clock signal CKa to the main block 92a.

As further depicted in FIG. 17, a drive voltage VCC is supplied to the voltage supply circuit 93. A second control signal SC2 is also input to the voltage supply circuit 93 from the control circuit 94. The voltage supply circuit 93 supplies a first drive voltage VCa and a second drive voltage VCb respectively to the main block 92a and the backup block 92b based on the drive voltage VCC. In response to the second control signal SC2, the voltage supply circuit 23 controls supply/stop of the first drive voltage VCa and the second drive voltage VCb.

As further depicted in FIG. 17, the main block 92a and the backup block 92b may include a similar circuit configuration and may provide a similar function (i.e., the function of a high-speed processing circuit). The main block 92a comes into an operable state with the first drive voltage VCa supplied thereto and operates in sync with the first clock signal CKa. Similarly, the backup block 92b comes into an operable state with the second drive voltage VCb supplied thereto and operates in sync with the second clock signal CKb.

Each of the main block 92a and the backup block 92b includes a monitor circuit and a determination circuit (both not depicted), which include similar configurations as those in one of the above-described embodiments. The determination circuits in the blocks 92a and 92b produce respectively first and second determination signals SJa and SJb based on the output signals of the monitor circuits.

As further depicted in FIG. 17, the first determination signal SJa output from the main block 92a and the second determination signal SJb output from the backup block 92b are input to the control circuit 94. In response to the first determination signal SJa, the control circuit 94 switches over the sub-block that is to be operated. Stated another way, the control circuit 94 produces the first control signal SC1 and the second control signal SC2 such that the operating sub-block is switched over from the main block 92a to the backup block 92b.

The main block 92a and the backup block 92b include circuits (e.g., flip-flop circuits) for holding respective signals. The main block 92a and the backup block 92b may be designed such that, during the operation of the main block 92a, the states of the holding circuits in the main block 92a are copied into the corresponding holding circuits in the backup block 92b.

As further depicted in FIG. 17, during a period in which the main block 92a operates normally, the voltage supply circuit 93 does not supply the second drive voltage VCb to the backup block 92b in accordance with the control signal SC2 from the control circuit 94. Further, in response to the control signal SC2 from the control circuit 94, the voltage supply circuit 93 supplies the second drive voltage VCb to the backup block 92b. Correspondingly, the backup block 92b starts the operation. At that time, signal levels in the backup block 92b (i.e., signal levels at input/output terminals of a circuit) are determined depending on a rising state of a voltage level at a power supply terminal of the circuit and an initialization signal. In other words, the operating state of the backup block 92b differs from the operating state of the main block 92a.

In case that the operating state of the main block 92a is copied into the backup block 92b as described above, the operating state of the backup block 92b becomes similar to that of the main block 92a. Accordingly, even after the operating sub-block has been switched from the main block 92a to the backup block 92b, the processing to be executed in the main block 92a is continuously executed in the relevant backup block 92b.

The configuration for copying the state is described below.

As further depicted in FIGS. 17 and 18, the main block 92a includes a plurality (three in the drawing) of scan flip-flops (hereinafter abbreviated to "SFFs") 110a to 103a and a logic circuit 104a.

A data signal DI1 is supplied to a data input terminal D of the SFF 101a, and an output terminal Q of the SFF 101a is coupled to the logic circuit 104a. A data signal DI2 is supplied to a data input terminal D of the SFF 102a, and an output terminal Q of the SFF 102a is coupled to the logic circuit 104a. An output signal of the logic circuit 104a is supplied to a data input terminal D of the SFF 103a. The SFF 103a outputs a data signal DOM.

A scan mode signal SM is supplied to each of the SFFs 101a to 103a. Further, the first clock signal CKa for the main block 92a is supplied (though not fully depicted) to each of the SFFs 101a to 103a. In response to the first clock signal CKa, each of the SFFs 101a to 103a holds a level of a signal supplied to each of terminals D and SIN, which corresponds to a level of the scan mode signal SM, and then outputs a signal at the held level. For example, each of the SFFs 101a to 103a holds a level of a signal supplied to the data input terminal D, which corresponds to the scan mode signal SM at a L-level, and then outputs a signal at the held level. Further, each SFF holds a level of a signal supplied to the scan input terminal SIN, which corresponds to the scan mode signal SM at a H-level, and then outputs a signal at the held level.

Accordingly, in case that the scan mode signal SM is at the L-level, the SFF 101a holds a level of the data signal DI1 and then outputs a signal having a similar level as the held level. The SFF 102a holds a level of the data signal DI2 and then outputs a signal having a similar level as the held level. The logic circuit 104a processes the output signals of the SFFs 101a and 102a and outputs a signal produced through the processing. The SFF 103a holds a level of the output signal of the logic circuit 104a and then outputs the signal DOM having a similar level as the held level. On the other hand, in case that the scan mode signal SM is at the H-level, the SFFs 101a to 103a hold respective levels of signals supplied from paths SP1a, SP2a and SP3a of scan chains in preceding stages, respectively, and then output signals having similar levels as the held levels.

Figure 18:
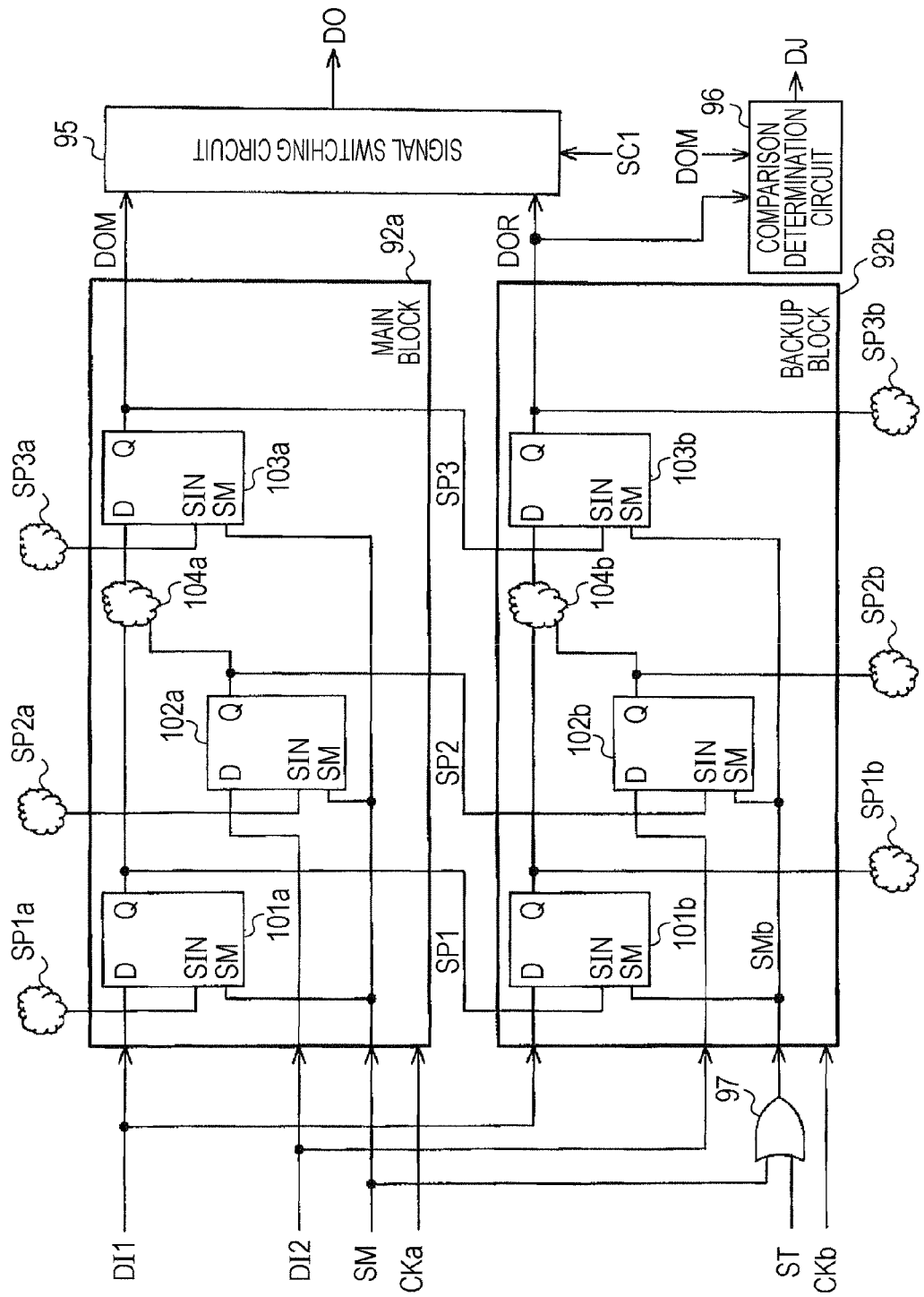
FIG. 18 depicts a main block and a backup block in FIG. 17.

As further depicted in FIGS. 17 and 18, the backup block 92b includes three SFFs 101b to 103b and a logic circuit 104b.

The second clock signal CKb for the backup block 92b is supplied (though not fully depicted) to each of the SFFs 101b to 103b. The data signal DI1 is supplied to a data input terminal D of the SFF 101b, and an output terminal Q of the SFF 101b is coupled to the logic circuit 104b. The data signal DI2 is supplied to a data input terminal D of the SFF 102b, and an output terminal Q of the SFF 102b is coupled to the logic circuit 104b. An output signal of the logic circuit 104b is supplied to a data input terminal D of the SFF 103b. The SFF 103b outputs a data signal DOR.

Scan input terminals SIN of the SFFs 101b to 103b are coupled respectively to the output terminals Q of the corresponding SFFs 101a to 103a in the main block 92a. For example, the scan input terminal SIN of the SFF 101b is coupled to the output terminal Q of the corresponding SFF 101a. The scan input terminal SIN of the SFF 102b is coupled to the output terminal Q of the corresponding SFF 102a. The scan input terminal SIN of the SFF 103b is coupled to the output terminal Q of the corresponding SFF 103a. Further, the output terminals Q of the SFFs 101b to 103b are coupled respectively to paths SP1b, SP2b and SP3b of the scan chains.

Stated another way, the SFFs 101a and 101b are included in a path SP1 of the scan chain in cooperation with the path SP1a in the preceding stage and the path SP1b in the succeeding stage. Similarly, the SFFs 102a and 102b are included in a path SP2 of the scan chain in cooperation with the path SP2a in the preceding stage and the path SP2b in the succeeding stage. Further, the SFFs 103a and 103b are included in a path SP3 of the scan chain in cooperation with the path SP3a in the preceding stage and the path SP3b in the succeeding stage.

Mode input terminals SM of the SFFs 101b to 103b are coupled to an output terminal of the OR circuit 97. Not only the scan mode signal SM, but also a transfer control signal ST from the control circuit 94 are supplied to the OR circuit 97. Accordingly, in case that at least one of the scan mode signal SM and the transfer control signal ST is at a H-level, a signal SMb at a H-level is supplied to the mode input terminals SM of the SFFs 101b to 103b. In case that the scan mode signal SM and the transfer control signal ST are both at a L-level, the signal SMb at a L-level is supplied to the mode input terminals SM of the SFFs 101b to 103b.

For example, in case that the scan mode signal SM is at the H-level, the SFFs 101a to 103a in the main block 92a hold signals, which are supplied to the respective scan input terminals SIN through the paths SP1a, SP2a and SP3a, in response to the first clock signal CKa, and then output signals at the held levels. Further, the SFFs 101b to 103b in the backup block 92b hold signals, which are supplied to the respective scan input terminals SIN from the SFFs 101a to 103a in the main block 92a, in response to the second clock signal CKb, and then output signals at the held levels.

Stated another way, in case that the scan mode signal SM is at the H-level, the SFF 101a in the main block 92a and the SFF 101b in the backup block 92b operate as part of the scan chain. Similarly, in case that the scan mode signal SM is at the H-level, the pair of SFF 102a and SFF 102b and the pair of SFF 103a and 103b also operate as part of the scan chain. Thus, in the function block 90, part of the continuous scan chain is formed to extend from the main block 92a to the backup block 92b through the corresponding pairs of SFFs.

In case that the scan mode signal SM is at the L-level and the transfer control signal ST is at the H-level, the SFFs 101b to 103b in the backup block 92b hold the signals supplied to the respective scan input terminals SIN, i.e., the signals output from the SFFs 101a to 103a in the main block 92a, and then output signals at the held levels. In other words, the signal levels held in the SFFs 101a to 103a in the main block 92a are copied into the SFFs 101b to 103b in the backup block 92b.

In case that the scan mode signal SM and the transfer control signal ST are both at the L-level, the SFFs 101a to 103a in the main block 92a and the SFFs 101b to 103b in the backup block 92b hold the signals supplied to the respective data input terminals D, and then output signals at the held levels. Accordingly, the main block 92a and the backup block 92b successively take in and process the respective input signals DI1 and DI2 in response to the clock signals CKa and CKb and output the respective output signals DOM and DOR, which have been produced through the processing, by setting the transfer control signal ST to the H-level for copying respective information of the SFFs 101a to 103a in the main block 92a into the SFFs 101b to 103b in the backup block 92b, and thereafter by setting the transfer control signal ST to the L-level. At that time, the processing executed by the backup block 92b is similar to that executed by the main block 92a. Accordingly, even if the main block 92a is stopped after copying the state of the main block 92a into the backup block 92b, the processing to be executed in the main block 92a is continuously executed in the backup block 92b.

With the above-described configuration, however, the first clock signal CKa and the second clock signal CKb are produced based on the clock signal CLK. The SFFs 101a to 103a in the main block 92a hold signals in response to the first clock signal CKa, and the SFFs 101b to 103b in the backup block 92b hold signals in response to the second clock signal CKb. Further, the SFFs 101b to 103b in the backup block 92b hold respectively the output signals of the SFFs 101a to 103a in the main block 92a. Accordingly, data held by the SFFs 101b to 103b in the backup block 92b are shifted one clock cycle from data held by the SFFs 101a to 103a in the main block 92a.

Because of such a shift, for example, at the time of switching from the main block 92a to the backup block 92b, the output signal DOM of the main block 92a and the output signal DOR of the backup block 92b, which are output at similar timing, may not be similar data. Therefore, the switching from the main block 92a to the backup block 92b may not be performed in such a manner as continuing the operation of the function block 90 without stopping the operation.

To compensate for the above-described shift, the control circuit 94 outputs, in response to the failure determination signal SJa, a one-shot pulse signal as a clock signal for copying data from the main block 92a to the backup block 92b in case that the second clock signal CKb starts to be produced. Thereafter, the control circuit 94 outputs the second clock signal CKb having a substantially similar cycle as the clock signal CLK. In other words, the second clock signal CKb includes a one-shot pulse signal having a shorter cycle than the clock signal CLK and a pulse signal having a similar cycle as the clock signal CLK.

As further depicted in FIGS. 17 and 18, the control circuit 94 outputs the one-shot pulse signal between the first clock signal CKa used to hold the to-be-copied data in the main block 92a and a next cycle subsequent to that first clock signal CKa. The SFFs 101b to 103b in the backup block 92b hold the signals output from the SFFs 110a to 103a in the main block 92a in response to the one-shot pulse signal, and then output the held signals. Thus, the signals output from the SFFs 101b to 103b in the backup block 92b become similar to those output from the SFFs 101a to 103a in the main block 92a. In other words, the above-described shift is compensated for.

As further depicted in FIGS. 17 and 18, the comparison determination circuit 96 compares the signal DOM output from the main block 92a with the signal DOR output from the backup block 92b, determines whether both the signals DOM and DOR match with each other, and outputs the signal determination signal DJ depending on the determination result. After confirming the match between both the signals DOM and DOR, the control circuit 94 switches over a signal selected by the signal switching circuit 95 from the output signal DOM of the main block 92a to the output signal DOR of the backup block 92b.

The configuration of the control circuit 94 is described below with reference to FIG. 19.

Figure 19:
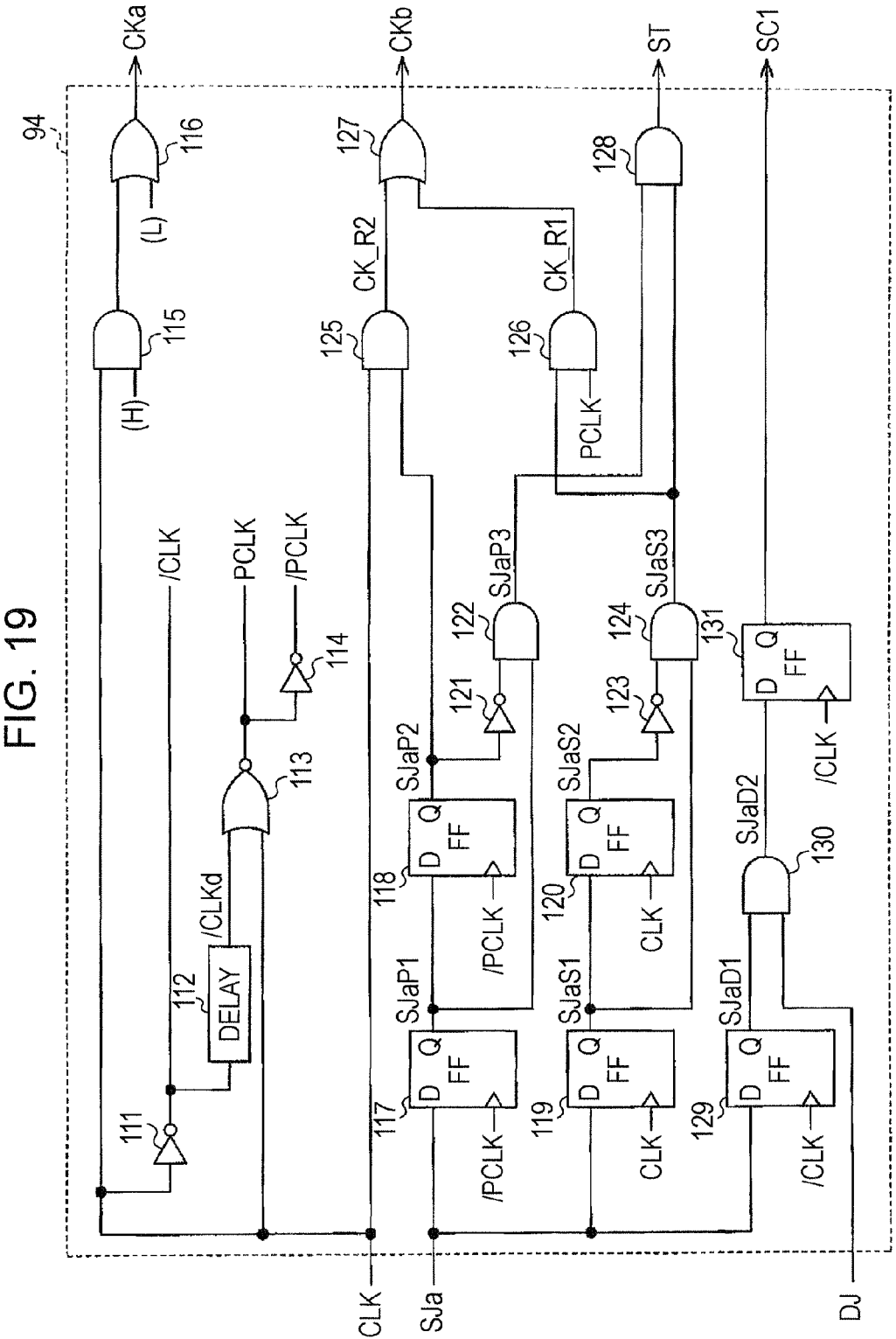
FIG. 19 depicts part of a control circuit in FIG. 17.

As depicted in FIG. 19, an inverter circuit 111 in the control circuit 94 outputs an inverted signal/CLK resulting from logically inverting the clock signal CLK. A delay circuit 112 outputs a signal/CLKd resulting from delaying the inverted signal/CLK. A NOR circuit 113 outputs a signal PCLK that is produced by taking the negative logical sum (NOT-OR) of the clock signal CLK and the signal/CLKd. An inverter circuit 114 outputs an inverted signal/PCLK resulting from logically inverting the signal PCLK.

As further depicted in FIG. 19, an AND circuit 115 includes one input terminal to which a H-level signal is input, and outputs a signal based on the clock signal CKa that is input to the other input terminal of the AND circuit 115. An OR circuit 116 includes one input terminal to which a L-level signal is input, and outputs the first clock signal CKa based on an output signal of the AND circuit 115.

As further depicted in FIG. 19, a FF 117 holds the failure determination signal S1a in sync with the signal/PCLK and outputs a signal SJaP1. A FF 118 holds the signal SJaP1, which is output from the FF 117, in sync with the signal/PCLK and outputs a signal SJaP2. A FF 119 holds the failure determination signal SJa in sync with the clock signal CLK and outputs a signal SJaS1. A FF 120 holds the signal SJaS2, which is output from the FF 119, in sync with the clock signal CLK and outputs a signal SJaS2.

As further depicted in FIG. 19, an inverter circuit 121 outputs a signal produced by logically inverting the signal SJaP2 that is output from the FF 118. An AND circuit 122 outputs a signal SJaP3 produced by taking the logical product (AND) of the signal SJaP1 output from the FF 117 and the output signal of the inverter circuit 121. An inverter circuit 123 outputs a signal produced by logically inverting the signal SJaS2 that is output from the FF 120. An AND circuit 124 outputs a signal SJaS3 produced by taking the logical product (AND) of the signal SJaS1 output from the FF 119 and the output signal of the inverter circuit 123.

As further depicted in FIG. 19, an AND circuit 128 outputs the signal ST produced by taking the logical product (AND) of the signal SJaP3 output from the AND circuit 122 and the signal SJaS3 output from the AND circuit 124.

An AND circuit 126 outputs a signal CK_R1 produced by taking the logical product (AND) of the signal SJaS3 output from the AND circuit 124 and the clock signal PCLK. An AND circuit 125 outputs a signal CK_R2 produced by taking the logical product (AND) of the signal SJaP3 output from the FF 118 and the clock signal CLK. An OR circuit 127 outputs the signal CKb produced by taking the logical sum (OR) of the signal CK_R1 output from the AND circuit 126 and the signal CK_R2 output from the AND circuit 125.

As further depicted in FIG. 19, a FF 129 holds the failure determination signal SJa in sync with the inverted signal/CLK and outputs a signal SJaD1. An AND circuit 130 outputs a signal SJaD2 produced by taking the logical product (AND) of the signal SJaD1 output from the FF 129 and the signal determination signal DJ. An FF 131 holds the signal SJaD2, which is output from the AND circuit 130, in sync with the inverted clock signal/CLK and outputs the control signal SC1.

Figure 20:
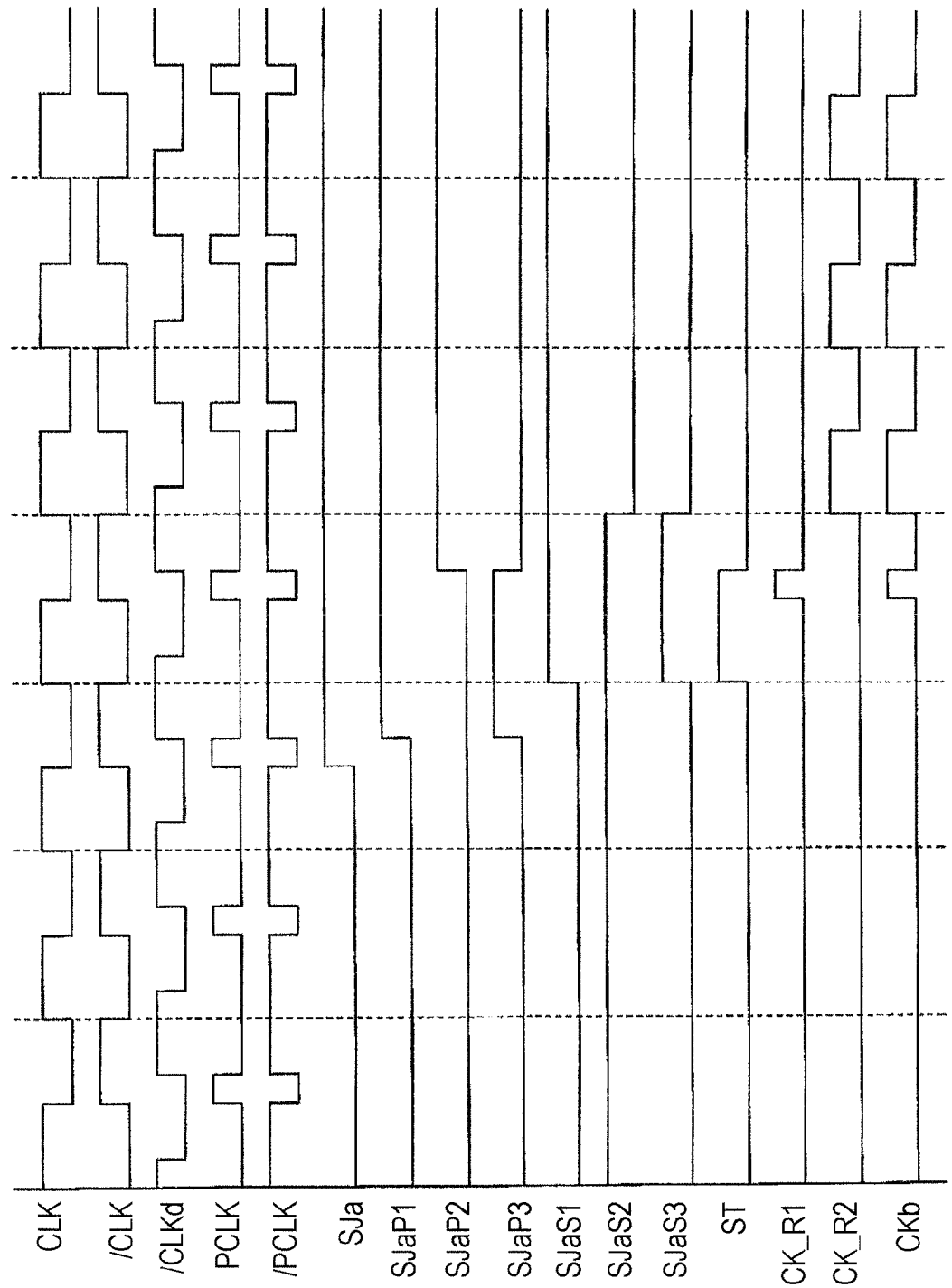
FIG. 20 depicts operation waveforms of a clock generation circuit related to FIG. 17.

As depicted in FIG. 20, the signal CK_R1 output from the AND circuit 126 is a one-shot pulse signal that is used as the clock signal for copying the data. The signal CK_R2 output from the AND circuit 125 is a toggle signal that is equivalent to the first clock signal CKa. The OR circuit 127 combines the signals CK_R1 and CK_R2 to produce the second clock signal CKb. Accordingly, the second clock signal CKb becomes a toggle signal equivalent to the first clock signal CKa after the one-shot pulse signal.

Operations of copying the data signal and switching over the block in aforementioned function block 90 is described below.

Figure 21:
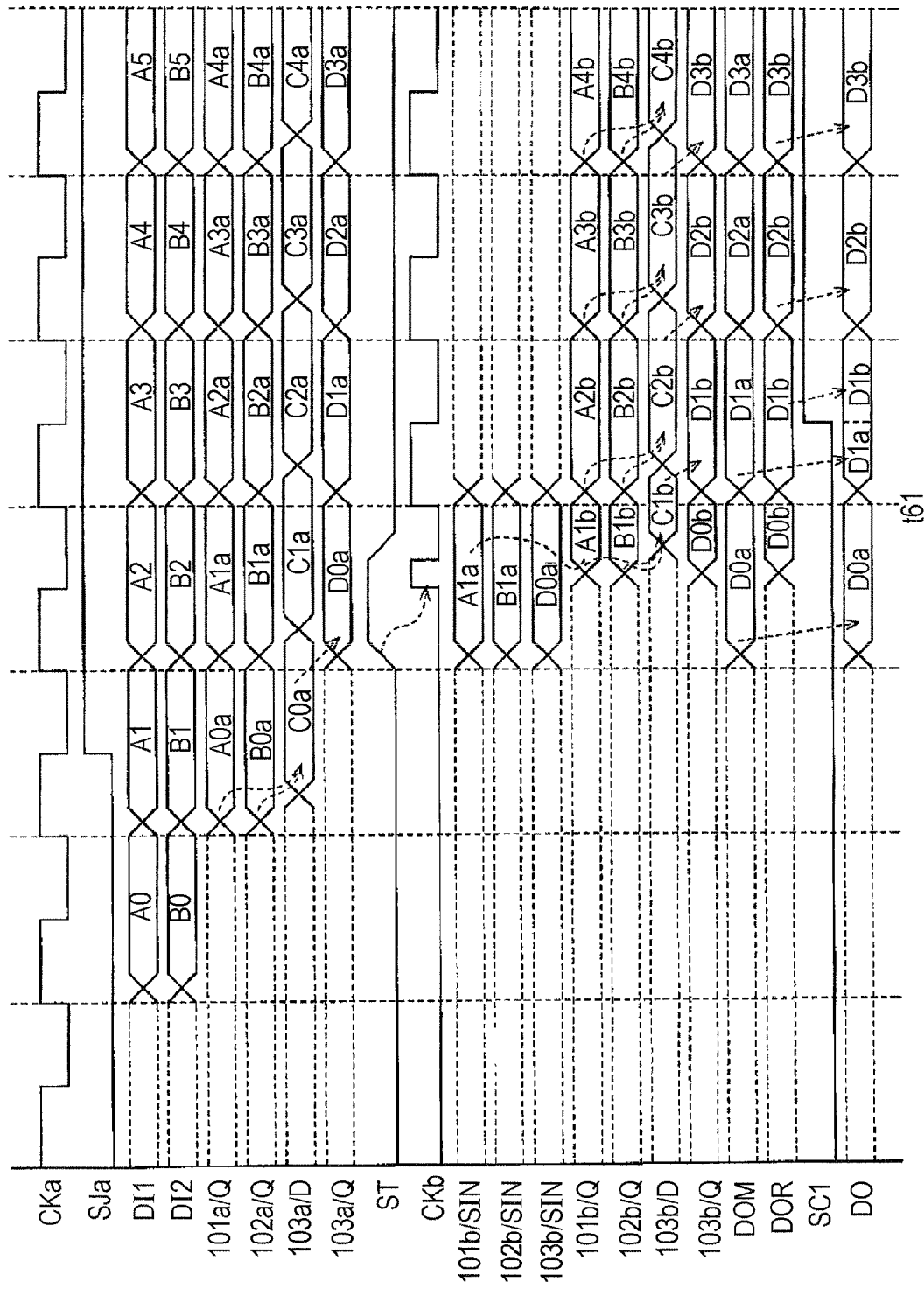
FIG. 21 depicts operation waveforms of the main block and the backup block in FIG. 17.

As depicted, by way of example, in FIG. 21, for easier understanding of the relationship between the lapse of time and the signals processed, the data signals DI1 successively supplied to the main block 92a and the backup block 92b are assumed to be signals A0, A1, A2, A3, etc., and the data signals D12 successively supplied thereto are assumed to be signals B0, B1, B2, B3, etc.

As depicted in FIG. 17, in case that the determination signal S1a at the H-level is output from the determination circuit in accordance with the monitoring signal output from the monitor circuit which is disposed in the main block 92a, the control circuit 94 outputs the second control signal SC2. In response to the second control signal SC2, the voltage supply circuit 93 supplies the drive voltage VCb to the backup block 92b.

The SFFs 101a and 102a in the main block 92a output respectively signals A0a and B0a corresponding to the signals A0 and B0 in sync with the rising edge of the first clock signal CKa. The logic circuit 104a outputs a signal C0a that is produced based on both the signals A0a and B0a.

The SFF 103a outputs a signal D0a corresponding to the signal C0a. At that time, the SFFs 101a and 102a output respectively signals A1a and B1a corresponding to the subsequent signals A1 and B1. Accordingly, the signals A1a, B1a and D0a output from the SFFs 101a to 103a in the main block 92a are supplied respectively to the scan input terminals SIN of the SFFs 101b to 103b in the backup block 92b.

Further, the signal D0a output from the SFF 103a is output, as the output signal DOM of the main block 92a, to the signal switching circuit 95. At that time, because the state of the main block 92a is not yet copied into the SFFs 101b to 103b in the backup block 92b, the signal output from the SFF 103b does not match with the signal DOM (=D0a) output from the SFFs 103a in the main block 92a. Accordingly, the comparison determination circuit 96 indicates a mismatch. For example, the comparison determination circuit 96 outputs the signal determination signal DJ at the L-level. The signal switching circuit 95 selects the signal DOM, which is output from the main block 92a, in response to the first control signal SC1 at the L-level and outputs a signal DO that is similar to the signal DOM.

Next, in case that the transfer control signal ST at the H-level is output from the control circuit 94, the SFF 101b to 103b in the backup block 92b output respectively signals A1b, B1b and D0b corresponding to the signals A1a, B1a and D0a, which are supplied to the respective scan input terminals SIN, in sync with a pulse signal of the second clock signal CKb generated during a H-level period of the transfer control signal ST, i.e., in sync with the rising edge of the second clock signal CKb. The logic circuit 104b outputs a signal C1b that is produced based on both the signals A1b and B1b. The transfer control signal ST turns to a L-level after the one-shot pulse signal of the second clock signal CKb has been generated.

Next, in case that the second clock signal CKb being in phase with the first clock signal CKa is output (time t61 in FIG. 21), the signal DOM (=D1a) output from the main block 92a and the signal DOR (=D1b) output from the backup block 92b are signals produced based on the signals A1 and B1, respectively, and are in match with each other. Accordingly, the comparison determination circuit 96 in FIG. 18 outputs the signal determination signal DJ (at, e.g., the H-level) indicating the match. The control circuit 94 outputs the first control signal SC1 at the H-level in response to that signal determination signal DJ. The signal switching circuit 95 selects the signal DOR, which is output from the backup block 92b, in response to the first control signal SC1 at the H-level and outputs a signal D0 that is similar to the signal DOR.

As understood from the above description, the sixth embodiment provides the following advantages.

(1) The main block 92a and the backup block 92b include circuits (e.g., flip-flop circuits) for holding respective signals. The main block 92a and the backup block 92b may be designed such that, during the operation of the main block 92a, the states of the holding circuits in the main block 92a are copied into the corresponding holding circuits in the backup block 92b within one cycle. In case that the operating state of the main block 92a is copied into the backup block 92b, the operating state of the backup block 92b becomes similar to that of the main block 92a. Accordingly, even after the operating sub-block has been switched from the main block 92a to the backup block 92b, the processing to be executed in the main block 92a is continuously executed in the relevant backup block 92b. Hence, in a system where power shutdown is not allowed, such as a server, the operating time of the system, i.e., the system life, is prolonged.

(2) In the function block 90, the scan chain is formed to extend from the main block 92a to the backup block 92b. The control circuit 94 copies the state of the main block 92a into the backup block 92b by utilizing the scan chain. Accordingly, an extra circuit for copying a signal may not need to be additionally provided, and an increase in circuit scale of the semiconductor device is suppressed.

(3) Usually, the scan chain is formed per block by coupling FFs (SFFs) within the block in series. In trying to copy a signal by using the scan chain, therefore, clock cycles may be needed in number corresponding to the number of FFs included in the scan chain within the block and a long data transfer time is taken. For that reason, the operation of the block may be stopped. In contrast, in the function block 90 of this sixth embodiment, the scan chain is formed to extend from the main block 92a to the backup block 92b by coupling the corresponding respective SFFs in both the blocks in a one-to-one relation. Such an arrangement enables data to be transferred in one clock cycle. Accordingly, the signal in the main block 92a is copied into the backup block 92b while the main block 92a continues the ordinary operation. Thus, the processing is continuously executed without stopping the processing.

A seventh embodiment is described with reference to FIGS. 22 to 24. For the convenience of explanation, similar components to those in the foregoing embodiments are denoted by similar reference numerals and a description of those components is omitted.

Figure 22:
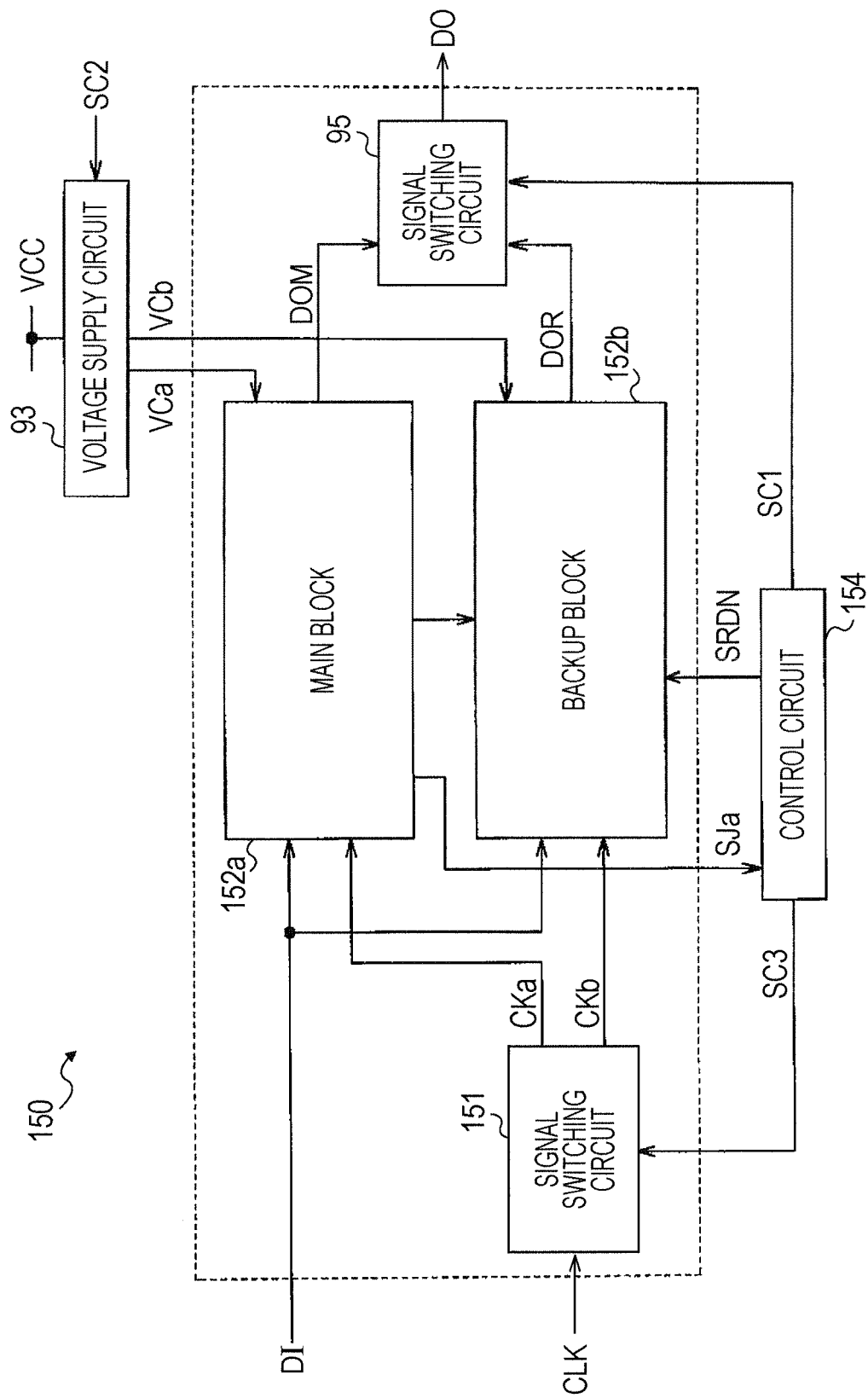
FIG. 22 depicts a seventh embodiment.

As depicted in FIG. 22, a function block 150 of the semiconductor device includes a first signal switching circuit 151, a main block 152a, a backup block 152b, a voltage supply circuit 93, a control circuit 154, and a second signal switching circuit 95.

As further depicted in FIG. 22, the clock signal CLK is input to the first signal switching circuit 151, and a third control signal SC3 from the control circuit 154 is also input as a clock control signal to the first signal switching circuit 151. The first signal switching circuit 151 supplies a first clock signal CKa and a second clock signal CKb, which are substantially similar to the clock signal CLK, to the main block 152a and the backup block 152b, respectively. Further, in response to the third control signal SC3, the first signal switching circuit 151 controls supply/stop of the first clock signal CKa and the second clock signal CKb.

As further depicted in FIG. 22, the main block 152a and the backup block 152b may include a similar circuit configuration and may provide a similar function (i.e., the function of a high-speed processing circuit). The main block 152a comes into an operable state with a first drive voltage VCa supplied thereto and operates in sync with the first clock signal CKa. Similarly, the backup block 152b comes into an operable state with a second drive voltage VCb supplied thereto and operates in sync with the second clock signal CKb.

Each of the main block 152a and the backup block 152b includes a monitor circuit and a determination circuit (both not depicted), which include similar configurations as those in one of the above-described embodiments. The determination circuits in the blocks 152a and 152b produce respectively first and second determination signals SJa and SJb based on output signals of the monitor circuits.

As further depicted in FIG. 22, the first determination signal SJa output from the main block 152a is input to the control circuit 154. In response to the first determination signal SJa, the control circuit 154 switches over the block that is to be operated. Stated another way, the control circuit 154 produces the first control signal SC1 and the second control signal SC2 such that the operating block is switched over from the main block 152a to the backup block 152b.

As further depicted in FIG. 22, the main block 152a and the backup block 152b include circuits (e.g., flip-flop circuits) for holding respective signals. The main block 152a and the backup block 152b may be designed such that, during the operation of the main block 152a, the states of the holding circuits in the main block 152a are copied into the corresponding holding circuits in the backup block 152b.

Figure 23:
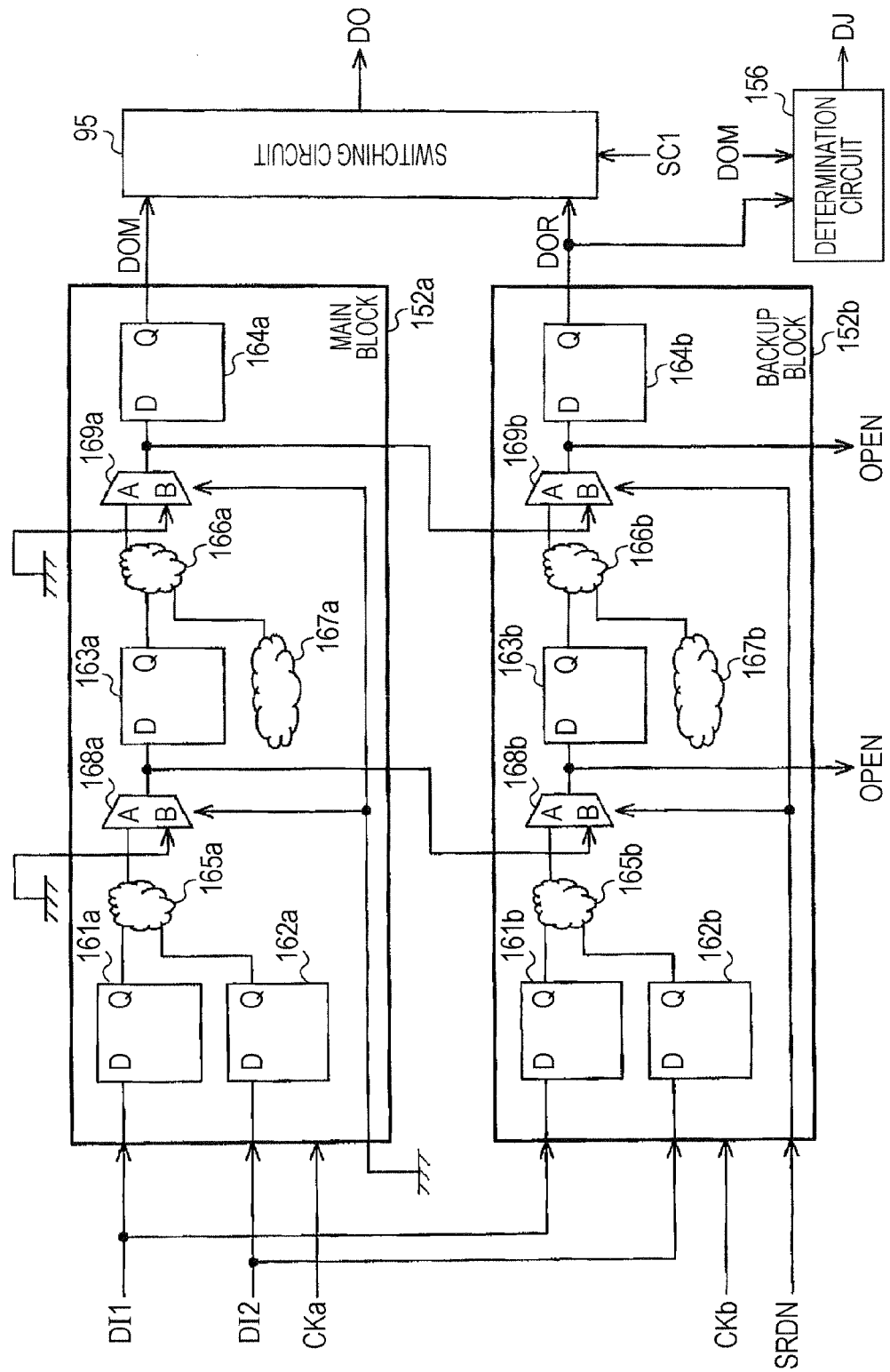
FIG. 23 depicts the main block and the backup block in FIG. 22.

As depicted in FIG. 23, the main block 152a includes, e.g., D flip-flop circuit (hereinafter abbreviated to "FFs") 161a to 164a as the circuits for holding signals. Though not depicted, the first clock signal CKa is supplied to clock input terminals of the FFs 161a to 164a. The FFs 161a to 164a hold levels of signals, which are supplied to the respective input terminals D, in response to the first clock signal CKa, and then output signals having similar levels as those held.

Thus, the FF 161*a* outputs a signal corresponding to a data signal DI1 supplied to its input terminal D. The FF 162*a* outputs a signal corresponding to a data signal DI2 supplied to its input terminal D. A logic circuit 165*a* processes the output signals of the FFs 161*a* and 162*a* and outputs a signal produced through the processing. The FF 163*a* outputs a signal corresponding to the signal output from the logic circuit 165*a*. A logic circuit 166*a* processes the output signal of the FFs 163*a* and the output signal of the logic circuit 167*a*, and outputs a signal produced through the processing. The FF 164*a* outputs a signal DOM corresponding to the signal output from the logic circuit 167*a*.

As further depicted in FIG. 23, the backup block 152*b* may include a similar configuration to that of the main block 152*a*. A FF 161*b* outputs a signal corresponding to the data signal DI1 supplied to its input terminal D. A FF 162*b* outputs a signal corresponding to the data signal DI2 supplied to its input terminal D. A logic circuit 165*b* processes the output signals of the FFs 161*b* and 162*b* and outputs a signal produced through the processing. A FF 163*b* outputs a signal corresponding to the signal output from the logic circuit 165*b*. A logic circuit 166*b* processes the output signal of the FFs 163*b* and the output signal of the logic circuit 167*b*, and outputs a signal produced through the processing. The FF 164*b* outputs a signal DOR corresponding to the signal output from the logic circuit 167*b*.

In the seventh embodiment, selection circuits are inserted in paths for transmitting signals to input terminals of those ones of the signal-holding FFs for which the signals may need to be copied. For example, selection circuits 168*a* and 169*a* are coupled to paths for transmitting signals to the input terminals of the FF 163*a* and FF 164*a* in the main block 152*a*. Further, selection circuits 168*b* and 169*b* are coupled to paths for transmitting signals to the input terminals of the FF 163*b* and FF 164*b* in the backup block 152*b*.

More detailed couplings in both the blocks 152*a* and 152*b* is described while comparing those blocks.

The signals from the logic circuits 165*a* and 165*b* are supplied to respective input terminals A of the selection circuits 168*a* and 168*b* in both the blocks 152*a* and 152*b*. Similarly, the signals from the logic circuits 166*a* and 166*b* are supplied to respective input terminals A of the selection circuits 169*a* and 169*b*.

Output terminals of the selection circuits 168*a* and 168*b* are coupled to the respective input terminals D of the FF 163*a* and the FF 163*b*. Similarly, output terminals of the selection circuits 169*a* and 169*b* are coupled to the respective input terminals D of the FF 164*a* and the FF 164*b*.

The low voltage VSS is supplied to input terminals B of the selection circuits 168*a* and 169*a* in the main block 152*a*, and input terminals B of the selection circuits 168*b* and 169*b* in the backup block 152*b* are coupled to the selection circuits 168*a* and 169*a*.

To each of the selection circuits 168*a* and 169*a* in the main block 152*a*, the low voltage VSS is supplied, as a selection signal, to select one of the signal supplied to the input terminal A and the signal supplied to the input terminal B. Thus, the selection circuits 168*a* and 169*a* in the main block 152*a* always select the signals supplied to the input terminals A in response to a level of the low voltage VSS, i.e., the selection signal at a L-level, and then output the selected signals to FF 163*a* and the FF 164*a* in the succeeding stages.

On the other hand, a selection signal SRDN is supplied from the control circuit 154 to the selection circuits 168*b* and 169*b* in the backup block 152*b*. The selection circuits 168*b* and 169*b* select the signals supplied to the input terminals A in response to the selection signal SRDN at a L-level, and select the signals supplied to the input terminals B in response to the selection signal SRDN at a H-level. Further, the selection circuits 168*b* and 169*b* output respectively the selected signals to the FF 163*b* and FF 164*b*.

For example, the selection circuit 168*b* selects the signal output from the logic circuit 165*b* in the backup block 152*b* in response to the selection signal SRDN at the L-level and then supplies the selected signal to the FF 163*b*. Further, the selection circuit 168*b* selects the signal output from the logic circuit 165*a* in the main block 152*a* in response to the selection signal SRDN at the H-level and then supplies the selected signal to the FF 163*b*. Similarly, the selection circuit 169*b* selects the signal output from the logic circuit 166*b* in the backup block 152*b* in response to the selection signal SRDN at the L-level and then supplies the selected signal to the FF 164*b*. Further, the selection circuit 169*b* selects the signal output from the logic circuit 166*a* in the main block 152*a* in response to the selection signal SRDN at the H-level and then supplies the selected signal to the FF 164*b*.

With the above-described operation of the selection circuit 168*b*, the signal output from the logic circuit 165*a* is supplied to the FF 163*a* in the main block 152*a* and the FF 163*b* in the backup block 152*b*. In other words, the signal held in the FF 163*a* in the main block 152*a* is copied into the FF 163*b* in the backup block 152*b* by the selection circuit 168*b* in the backup block 152*b*.

Similarly, with the above-described operation of the selection circuit 169*b*, the signal output from the logic circuit 166*a* is supplied to the FF 164*a* in the main block 152*a* and the FF 164*b* in the backup block 152*b*. In other words, the signal held in the FF 164*a* in the main block 152*a* is copied into the FF 164*b* in the backup block 152*b* by the selection circuit 169*b* in the backup block 152*b*.

The main block 152*a* includes the FF 161*a* and the FF 162*a* in addition to the above-described FF 163*a* and FF 164*a*. The backup block 152*b* includes the FF 161*b* and the FF 162*b* in addition to the above-described FF 163*b* and FF 164*b*. The data signal DI1 is supplied to the input terminal D of the FF 161*a* and the input terminal D of the FF 161*b*. Further, the data signal DI2 is supplied to the input terminal D of the FF 162*a* and the input terminal D of the FF 162*b*. Supply states of the signals DI1 and DI2 are similar to those of the signals obtained with the operations of the selection circuits 168*b* and 169*b*. In this seventh embodiment, therefore, the FFs 161*a*, 162*a*, 161*b* and 162*b* to which the signals DI1 and DI2 supplied from the outside of the blocks 152*a* and 152*b* are directly input are circuits for which the states (signal levels) may not need to be copied.

A (comparison) determination circuit 156 compares the signal DOM output from the main block 152*a* with the signal DOR output from the backup block 152*b*, determines whether both the signals DOM and DOR match with each other, and outputs a (signal) determination signal DJ depending on the determination result. For example, the determination circuit 156 determines in sync with the first clock signal CKa whether both the signals DOM and DOR match with each other. If the match between both the signals DOM and DOR is successively determined in a given number of times, the determination circuit 156 outputs the determination signal DJ (at, e.g., a H-level) indicating the match between both the signals DOM and DOR.

The given number of times set in the determination circuit 156 is set corresponding to a time required until the backup block 152*b*, to which the signal has been copied from the main block 152*a*, outputs a signal having a similar level as that in the main block 152*a*. For example, the determination circuit 156 stores a count value and sets the count value to be cleared ("0") in the initial state. The determination circuit 156 determines in sync with the first clock signal CKa (e.g., the rising edge of the first clock signal CKa) whether both the signals DOM and DOR match with each other. If the match between both the signals DOM and DOR is determined, the count value in counted up, and if the match between the signals DOM and DOR is not determined, the count value is cleared. In case that the count value reaches the given number of times, the determination circuit 156 outputs the determination signal DJ indicating the match between both the signals DOM and DOR.

After the match between both the signals DOM and DOR has been confirmed based on the determination signal DJ, the control circuit 154 switches over the signal, which is selected by the signal switching circuit 95, from the output signal DOM of the main block 152*a* to the output signal DOR of the backup block 152*b*.

In case that the operating state of the main block 152*a* is copied into the backup block 152*b* as described above, the operating state of the backup block 152*b* becomes similar to that of the main block 152*a*. Accordingly, even after the operating block has been switched from the main block 152*a* to the backup block 152*b*, the processing to be executed in the main block 152*a* is continuously executed in the relevant backup block 152*b*.

Figure 24:
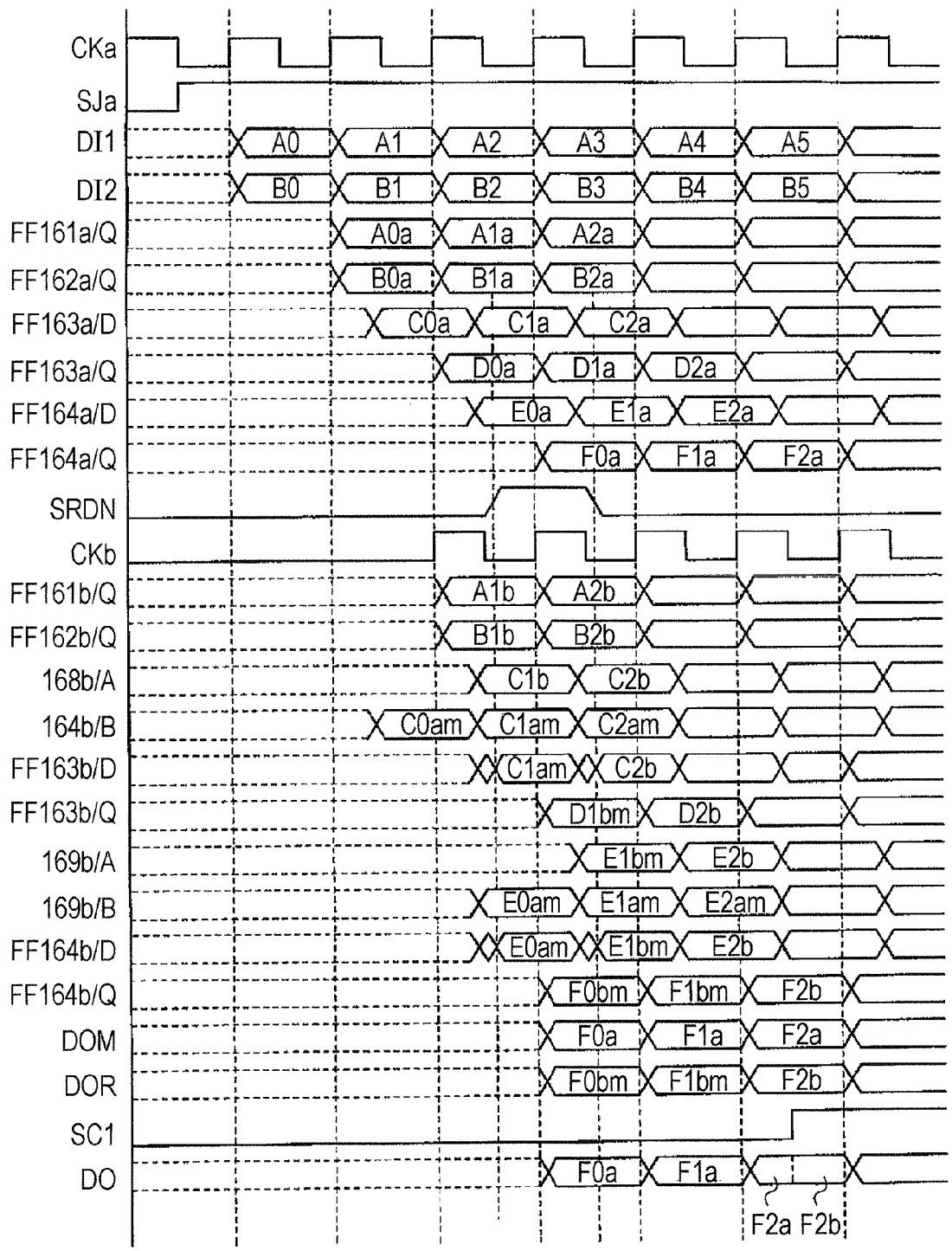
FIG. 24 depicts operation waveforms of the main block and the backup block in FIG. 22.

FIG. 24 is a timing chart in case that signals are copied from the main block 152*a* to the backup block 152*b* in the seventh embodiment. Note that, in FIG. 24 and the following description, [m] is suffixed to each signal copied from the main block 152*a* into the backup block 152*b* and to a signal produced based on the copied signal.

As depicted, by way of example, in FIG. 24, for easier understanding of the relationship between the lapse of time and the signals processed, the data signals DI1 successively supplied to the main block 152*a* and the backup block 152*b* are assumed to be signals A0, A1, A2, A3, etc., and the data signals DI2 successively supplied thereto are assumed to be signals B0, B1, B2, B3, etc.

As further depicted in FIGS. 22 to 24, in case that the determination signal S3*a* at the H-level is output from the determination circuit in accordance with the monitoring signal output from the monitor circuit which is disposed in the main block 152*a*, the control circuit 154 outputs the second control signal SC2 and the third control signal SC3. In response to the second control signal SC2, the voltage supply circuit 93 supplies the drive voltage VCb to the backup block 152*b*.

The FFs 161*a* and 162*a* in the main block 152*a* output respectively signals A0*a* and B0*a* corresponding to the signals A0 and B0 in sync with the rising edge of the first clock signal CKa. The logic circuit 165*a* outputs a signal which is produced based on both the signals A0*a* and B0*a*, and the produced signal is supplied, as a signal C0*a*, to the input terminal D of the FF 163*a*.

Next, the FF 163*a* outputs a signal D0*a* corresponding to the signal C0*a* in sync with the rising edge of the first clock signal CKa. At that time, the FF 161*a* and 162*a* output respectively signals A1*a* and B1*a* corresponding to the subsequent signals A1 and B1.

Next, the logic circuit 166*a* outputs a signal which is produced based on both the signal D0*a* output from the FF 163*a* and the signal output from the logic circuit 167*a*. The produced signal is supplied, as a signal E0*a*, to the input terminal D of the FF 164*a*. The FF 164*a* outputs a signal F0*a* corresponding to the signal E0*a* in sync with the rising edge of the first clock signal CKa. Further, the signal F0*a* output from the FF 164*a* is output, as the output signal DOM of the main block 152*a*, to the signal switching circuit 95.

On the other hand, as further depicted in FIGS. 22 to 24, the FFs 161*b* and 162*b* in the backup block 152*b* output respectively signals A1*b* and B1*b* corresponding to the signals A1 and B1 in sync with the rising edge of the second clock signal CKb. The logic circuit 165*b* outputs a signal C1*b* which is produced based on both the signals A1*b* and B1*b*. The signal C1*b* is supplied to the input terminal A of the selection circuit 168*b*. At that time, a signal C1*a* supplied to the FF 163*a* in the main block 152*a* is supplied, as a signal C1*am*, to the input terminal B of the selection circuit 168*b*. Further, the signal E0*a* supplied to the FF 164*a* in the main block 152*a* is supplied, as a signal E0*am*, to the input terminal B of the selection circuit 169*b*.

Upon supply of the selection signal SRDN at the H-level, the selection circuits 168*b* and 169*b* output respectively the signals C1*am* and E0*am* which are supplied to their input terminals B. The signals C1*am* and E0*am* are supplied to the input terminals D of the FFs 163*b* and 164*b*.

Next, the FF 163*b* outputs a signal D1*bm* corresponding to the signal C1*am* in sync with the rising edge of the second clock signal CKb. At a similar time, the FF 164*b* outputs a signal F0*bm* corresponding to the signal E0*am* in sync with the rising edge of the second clock signal CKb. Further, the signal F0*bm* output from the FF 164*b* is output, as the output signal DOR of the backup block 152*b*, to the signal switching circuit 95.

As further depicted in FIGS. 22 to 24, the signal switching circuit 95 outputs a signal DO that is similar to the output signal DOM of the main block 152*a*, i.e., the signal F0*a*, in response to the first control signal SC1 at the L-level.

The determination circuit 156 compares the signal DOM (=F0*a*) output from the main block 152*a* with the signal DOR (=F0*bm*) output from the backup block 152*b*. At that time, the output signal DOR of the backup block 152*b* includes a similar level as that of the signal input to the FF 164*b*, i.e., the level of the signal E0*am* (=E0*a*) supplied to the input terminal B of the selection circuit 169*b*. Therefore, the determination circuit 156 determines that both the signals DOM and DOR match with each other. Further, the determination circuit 156 counts up the count value (=1) and stores the counted-up value.

In the next cycle, in a similar manner to that described above, a signal F1*a* is output from the main block 152*a* and a signal F1*bm* is output from the backup block 152*b*. In response to the first control signal SC1 at the L-level, the signal switching circuit 95 outputs a signal DO that is similar to the output signal DOM of the main block 152*a*, i.e., the signal F1*a*.

For example, as further depicted in FIGS. 22 to 24, the determination circuit 156 compares the signal DOM (=F1*a*) output from the main block 152*a* with the signal DOR (=F1*bm*) output from the backup block 152*b*. At that time, the output signal DOR of the backup block 152*b* includes a similar level as that of the signal input to the FF 163*b* one cycle earlier, i.e., the level of the signal C1*am* (=C1*a*) supplied to the input terminal B of the selection circuit 169*b*. Therefore, the determination circuit 156 determines that both the signals DOM and DOR match with each other. Further, the determination circuit 156 counts up the count value (=2) and stores the counted-up value.

In the next cycle, in a similar manner to that described above, a signal F2*a* is output from the main block 152*a* and a signal F2*b* is output from the backup block 152*b*. In response to the first control signal SC1 at the L-level, the signal switching circuit 95 outputs a signal DO that is similar to the output signal DOM of the main block 152*a*, i.e., the signal F2*a*.

For example, as further depicted in FIGS. 22 to 24, the determination circuit 156 compares the signal DOM (=F2*a*) output from the main block 152*a* with the signal DOR (=F2*b*) output from the backup block 152*b*. At that time, the output signal DOR of the backup block 152*b* is a signal that is produced based on the signals A1 and B1 input respectively to the FFs 161*b* and 162*b* two cycles earlier. Accordingly, the signal DOM (=F2*a*) output from the main block 152*a* includes a similar level as that of the signal DOR (=F2*b*) output from the backup block 152*b*. Therefore, the determination circuit 156 determines that both the signals DOM and DOR match with each other. Further, the determination circuit 156 counts up the count value (=3) and stores the counted-up value.

Further, because the count value is now equal to the preset value, the determination circuit 156 outputs the first control signal SC1 at the H-level at a given timing (e.g., a timing in sync with the falling edge of the second clock signal CKb). In response to the first control signal SC1 at the H-level, the signal switching circuit 95 outputs a signal DO that is similar to the output signal DOR of the backup block 152*b*, i.e., the signal F2*b*.

As understood from the above description, the seventh embodiment provides the following advantages.

(1) The main block 152*a* and the backup block 152*b* include circuits (e.g., flip-flop circuits) for holding respective signals. The main block 152*a* and the backup block 152*b* may be designed such that, during the operation of the main block 152*a*, the states of the holding circuits in the main block 152*a* are copied into the corresponding holding circuits in the backup block 152*b*. Accordingly, this seventh embodiment may also provide similar advantages to those obtained with the sixth embodiment.

The above-described embodiments may be practiced in various modifications as follows:

While the above-described embodiments are each implemented as the semiconductor device which is operated using two clock signals CLK and CLK2 having different frequencies from each other, other embodiments may be implemented as semiconductor devices in which three or more clock signals may be needed.

While the above-described embodiments are each implemented as the semiconductor device which includes the main block (e.g., 22*a*) and one backup block (e.g., 22*b*), other embodiments may be implemented as semiconductor devices including two or more backup blocks. In such a case, the control circuit switches over a plurality of backup blocks in accordance with the preset sequence.

While, in the above-described first embodiment, each of the main block 22*a* and the backup block 22*b* includes three processing circuits 35*a* to 37*a* and 35*b* to 37*b*, respectively, each block may include one, two, or four or more processing circuits.

In each of the above-described embodiments, at least two of the plural processing circuits included in the main block (e.g., 22*a*) and the backup block (e.g., 22*b*) may execute similar processing.

While, in the above-described embodiments, the main block (e.g., 22*a*) and the backup block (e.g., 22*b*) include one buffer circuit (e.g., 31*a* and 31*b*), respectively, each block may include a plurality of buffer circuits. Further, the monitor circuit (e.g., 38*a*) may be disposed near each of the plural buffer circuits.

While the above-described seventh embodiment is implemented using the blocks 152*a* and 152*b* each of which includes DFFs as circuits for holding signals, each block may include other types of flip-flops, registers, etc. as the circuits for holding signals.

While, in the above-described seventh embodiment, the determination circuit 156 determines in sync with the first clock signal CKa whether both the signals DOM and DOR match with each other, the determination circuit 156 may determine in sync with the second clock signal CKb whether both the signals DOM and DOR match with each other. Alternatively, the determination circuit 156 may determines whether both the signals DOM and DOR match with each other, by using a signal produced based on the clock signal CKa or CKb through a delay circuit, a one-shot pulse generation circuit, etc.

The frequency dividers 72 and 73 in the above-described fourth embodiment may be applied to the other embodiments.

In the above-described embodiments, the control circuit may store the determination result. In the first embodiment, for example, the control circuit 24 includes a nonvolatile memory 24*a*, as depicted in FIG. 2. The control circuit 24 writes the determination result in the nonvolatile memory 24*a* and outputs the control signal in accordance with the stored determination result upon subsequent power-on. The control circuit 24 may not be needed to include the nonvolatile memory 24*a* so long as the control circuit 24 may confirm or change the contents of the nonvolatile memory 24*a*.

According to the above-described embodiments, since the load of the first element is increased by the load element, the first element is more sensitive to the electro-migration than an element provided with no load element. Since the determination unit determines the operating state of the first element based on the output of the monitor including the first element, the position where the first element is arranged, i.e., the occurrence of a local failure, may be detected, for example.

According to the above-described embodiments, since the first element is arranged near the clock buffer for buffering the clock signal and the load of the first element is increased by the load element in comparison with the load of the clock buffer, the first element is more sensitive to the electro-migration than the clock buffer. Since the determination unit determines the operating state of the first element based on the output of the monitor including the first element, the occurrence of a local failure attributable to the cycle of the clock signal may be detected, for example.

According to the above-described embodiments, since the first element is arranged near the clock buffer for buffering a main clock signal in the main block and the load of the first element is increased by the load element in comparison with the load of the clock buffer, the first element is more sensitive to the electro-migration than the clock buffer. Since the determination unit determines the operating state of the first element based on the output of the monitor including the first element, the occurrence of a local failure attributable to the cycle of the main clock signal may be detected, for example. Further, since the operating block is switched over from the main block to the backup block in accordance with the determination signal output from the determination unit, the operating term of the semiconductor device becomes longer than that of the semiconductor device including only the main block.

According to the above-described embodiments, the semiconductor device and the operation monitoring method for the semiconductor device detect a failure locally generated, for example.

Numbers applying embodiments (first, second or third etc.) do not show priorities of the embodiments. Many variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor device comprising:
a monitor including a first element coupled between a first power supply line and a second power supply line, and a load for increasing a load value between the first element and the first power supply line or the second power supply line;
a determination unit which determines an operating state of the first element based on an output of the monitor; and
a switching circuit that selectively switches between a first supply of a clock signal to a first block so as to operate the first block and stop an operation of a second block and a second supply of the clock signal to the second block so as to operate the second block and stop an operation of the first block based on an output of the determination circuit,
a second element coupled between the first power supply line and the second power supply line and including similar characteristics as the first element; and
a circuit driven by the second element,
wherein the determination unit determines whether the circuit is driven by the second element based on the operating state.

2. The semiconductor device according to claim 1, further comprising:
a signal supplier supplying or stopping a signal provided by the first element;
wherein the determination unit determines the operating state of the first element based on the output of the monitor and an output of the signal supplier.

3. The semiconductor device according to claim 1, wherein the load is a capacitor coupled to an output terminal of the first element.

4. The semiconductor device according to claim 1, wherein the load comprises a capacitor coupled to an output terminal of the first element and a resistor coupled between the first element and the first power supply line or the second power supply line.

5. The semiconductor device according to claim 1, wherein the load is a capacitor coupled to an output terminal of the first element and the capacitor includes a load capacity larger than a load capacity in the circuit.

6. The semiconductor device according to claim 1, wherein the load is a resistor coupled between the first element and the first power supply line or the second power supply line.

7. The semiconductor device according to claim 1, wherein the signal supplied from the signal supplier is a clock signal.

8. The semiconductor device according to claim 7, wherein the determination unit outputs a determination signal at a first level in case that if both of an output signal of the first element and an output signal of the second element undergo a clock operation cyclically changing a signal level, or in case that both the output signals undergo a non-clock operation, and the determination unit outputs a determination signal at a second level differing from the first level in case that the output signal of the first element undergoes the non-clock operation and the output signal of the second element undergoes the clock operation.

9. The semiconductor device according to claim 1, further comprising:
a buffer buffering a clock signal; and
a circuit to which an output signal of the clock buffer is supplied,
wherein the first element is arranged near the clock buffer.

10. A semiconductor device comprising:
a first function block operating in accordance with a first clock signal; and
a second function block operating in accordance with a second clock signal having a lower frequency than the first clock signal,
wherein the first function block comprises:
a main block comprising a first buffer buffering a clock signal, a first circuit to which an output signal of the first buffer is supplied, a first monitor including a first element which is arranged near the buffer and is coupled between a first power supply line and a second power supply line, and to which the clock signal is supplied, the monitor further including a first load for increasing a load between the first element and the first power supply line or the second power supply line, and a first determination unit for determining an operating state of the first element based on an output of the monitor;
a backup block comprising a second buffer buffering a clock signal, a second circuit to which an output signal of the second buffer is supplied, a second monitor including a second element which is arranged near the buffer and is coupled between a first power supply line and a second power supply line, and to which the clock signal is supplied, the monitor further including a second load for increasing a load between the second element and the first power supply line or the second power supply line, and a second determination unit for determining an operating state of the second element based on an output of the monitor; and
a signal switching circuit capable of producing, based on the first clock signal, a main clock signal serving as an operation signal for the main block and a backup clock signal serving as an operation signal for the backup block, the backup clock signal having a similar cycle as the main clock signal, and capable of switching over supply and stop of the main clock signal and the backup clock signal in accordance with a clock control signal,
wherein the main clock signal serving as the operation signal for the main block and the backup clock signal serving as the operation signal for the backup block and having a similar cycle as the main clock signal are produced based on the first clock signal, and the supply and the stop of the main clock signal and the backup clock signal is switched over in accordance with a clock control signal which is produced based on a determination signal from the determination unit.

11. The semiconductor device according to claim 10, wherein the main block comprises a plurality of first buffers, and wherein the first monitor is arranged near at least one of the plurality of first buffers.

12. The semiconductor device according to claim 11, wherein the main block comprises a plurality of first monitors, a plurality of first determination units coupled respectively to the first monitors, and a logical circuit calculating the logical sum (OR) of determination signals output from the plurality of first determination units and producing a determination signal based on the calculation, and
wherein the main block produces the clock control signal based on the determination signal.

13. The semiconductor device according to claim 10, wherein each of the main block and the backup block comprises a plurality of holding circuits for holding data, and
wherein the data held in the plurality of holding circuits in the main block are formed to be capable of being copied respectively into the corresponding holding circuits in the backup block.

14. The semiconductor device according to claim 13, wherein the holding circuits are scan flip-flops, and
wherein output terminals of the scan flip-flops in the main block are coupled to scan input terminals of the corresponding scan flip-flops in the backup block.

15. The semiconductor device according to claim 14, further comprising:
a signal switching circuit to which an output signal of the main block and an output signal of the backup block are input, and which selectively outputs the output signal of the main block and the output signal of the backup block in a switching manner in response to an output control signal; and
a determination circuit for determining whether the output signal of the main block and the output signal of the backup block match with each other, and producing a determination signal depending on a determination result,
wherein the clock control signal is produced to perform switching from the main block to the backup block after the match between the output signal of the main block and the output signal of the backup block has been confirmed based on the determination signal.

16. The semiconductor device according to claim 14, wherein the signal switching circuit outputs, as the backup clock signal, a one-shot pulse signal in response to the clock control signal, and thereafter outputs, as the backup clock signal, a pulse signal which is similar to the main clock signal.

17. The semiconductor device according to claim 13, wherein the holding circuits are flip-flops, a signal is supplied as a first signal to an input terminal of each of the flip-flops, and an output terminal of a selection circuit is coupled to the input terminal of each of the flip-flops, the first signal and an output signal of the corresponding flip-flop in the main block being both input to the selection circuit for the backup block,
wherein the selection circuit for the backup block selectively outputs the first signal and the output signal of the corresponding flip-flop in the main block in response to a selection signal.

18. The semiconductor device according to claim 1, further comprising:
a power supplier supplying or stopping a power to the monitor and the determination unit based on the output of the monitor.

19. The semiconductor device according to claim 1, wherein the determination unit includes a comparator to compare a signal based on the output of the monitor with a threshold signal.

* * * * *